(12) United States Patent
Yamaguchi

(10) Patent No.: US 11,335,702 B1
(45) Date of Patent: May 17, 2022

(54) SEMICONDUCTOR DEVICE AND METHOD OF MANUFACTURING THE SAME

(71) Applicant: RENESAS ELECTRONICS CORPORATION, Tokyo (JP)

(72) Inventor: Tadashi Yamaguchi, Tokyo (JP)

(73) Assignee: RENESAS ELECTRONICS CORPORATION, Tokyo (JP)

(*) Notice: Subject to any disclaimer, the term of this patent is extended or adjusted under 35 U.S.C. 154(b) by 0 days.

(21) Appl. No.: 17/097,823

(22) Filed: Nov. 13, 2020

(51) Int. Cl.
| | |
|---|---|
| *H01L 27/1159* | (2017.01) |
| *H01L 29/78* | (2006.01) |
| *H01L 29/66* | (2006.01) |
| *H01L 21/28* | (2006.01) |
| *H01L 21/02* | (2006.01) |
| *H01L 27/11585* | (2017.01) |
| *H01L 29/51* | (2006.01) |

(52) U.S. Cl.
CPC .... *H01L 27/1159* (2013.01); *H01L 21/02181* (2013.01); *H01L 27/11585* (2013.01); *H01L 29/40111* (2019.08); *H01L 29/516* (2013.01); *H01L 29/6684* (2013.01); *H01L 29/78391* (2014.09)

(58) Field of Classification Search
CPC ......... H01L 21/02181; H01L 27/11585; H01L 27/1159; H01L 29/40111; H01L 29/516; H01L 29/6684; H01L 29/78391
See application file for complete search history.

(56) References Cited

U.S. PATENT DOCUMENTS

| | | | |
|---|---|---|---|
| 2019/0067488 A1* | 2/2019 | Tsai | H01L 21/28194 |
| 2019/0207009 A1 | 7/2019 | Yamaguchi | |
| 2019/0244973 A1* | 8/2019 | Yoo | H01L 27/11585 |
| 2021/0391472 A1* | 12/2021 | Tsai | H01L 29/6684 |

FOREIGN PATENT DOCUMENTS

| | | | | |
|---|---|---|---|---|
| CN | 1689161 A | * | 10/2005 | |
| DE | 10308970 A1 | * | 9/2004 | ....... H01L 29/78391 |
| JP | 2002057301 A | * | 2/2002 | |
| JP | 2019-121633 A | | 7/2019 | |
| KR | 20200032966 A | * | 3/2020 | ............. H01L 28/90 |

* cited by examiner

*Primary Examiner* — Matthew E Warren
(74) *Attorney, Agent, or Firm* — McDermott Will & Emery LLP

(57) ABSTRACT

A semiconductor device includes a semiconductor substrate, an insulating film, a ferroelectric film, a first seed layer and a control gate electrode. The semiconductor substrate includes a source region and a drain region which are formed on a main surface of the semiconductor substrate. The insulating film is formed on the main surface of the semiconductor substrate such that the insulating film is positioned between the source region and the drain region in a plan view. The ferroelectric film is formed on the insulating film and includes hafnium and oxygen. The first seed layer is formed on the ferroelectric film. The control gate electrode is formed on the ferroelectric film. A material of the first seed layer includes at least one material of the ferroelectric film and at least one material of the first conductive film.

12 Claims, 40 Drawing Sheets

FIG. 3

| VOLTAGE [V] \ OPERATION | Vd | Vg | Vs | Vw |
|---|---|---|---|---|
| WRITE | 0 | $-V_{EC}$ | 0 | 0 |
| ERASE | 0 | $V_{EC}$ | 0 | 0 |
| READ | 0 | 0 | $V_{dd}$ | 0 |

FIG. 24

| VOLTAGE [V] \ OPERATION | Vs | Vd | Vw | V1 | V2 |
|---|---|---|---|---|---|
| WRITE | 0 | 0 | $V_{EC}$ | $V_{EC}$ | $-V_{EC}$ |
| ERASE | 0 | 0 | $-V_{EC}$ | $-V_{EC}$ | $V_{EC}$ |
| READ | $V_{dd}$ | 0 | 0 | $V_R$ | $V_R$ |

SEMICONDUCTOR DEVICE AND METHOD OF MANUFACTURING THE SAME

BACKGROUND

A present disclosure relates to a semiconductor device and a method of manufacturing the semiconductor device, for example, a semiconductor device including a ferroelectric film and a method of manufacturing the semiconductor device.

There is a disclosed technique listed below.
[Patent Document 1] Japanese Unexamined Patent Application Publication No. 2019-121633

A ferroelectric memory including a ferroelectric film is known as a storage element operating at low voltages. In the ferroelectric memory, a write state and an erase state are determined in accordance with a polarization direction of the ferroelectric film.

A semiconductor device described in Patent Document 1 includes a semiconductor substrate, a paraelectric film formed on the semiconductor substrate, a ferroelectric film formed on the paraelectric film, a metal film formed on the ferroelectric film, and a control gate electrode formed on the metal film. The ferroelectric film described in Patent Document 1 is formed by crystallizing a high-k film in an amorphous state including hafnium (Hf) by heat treatment.

SUMMARY

However, in the conventional semiconductor device, there is room for improving from the viewpoint of enhancing the characteristics.

A problem of the present embodiments is improving of the characteristics of a semiconductor device. Other problems and novel features will become apparent from the description of the specification and drawings.

A semiconductor device according to the embodiments includes a semiconductor substrate including a source region and a drain region formed on a main surface of the semiconductor substrate, an insulating film formed on the main surface of the semiconductor substrate such that the insulating film is positioned between the source region and the drain region in a plan view, a ferroelectric film formed on the insulating film, the ferroelectric film including hafnium and oxygen, a first seed layer formed on the ferroelectric film, and a control gate electrode formed on the ferroelectric film. A material of the first seed layer includes at least one material of the ferroelectric film and at least one material of the first conductive film.

A method of manufacturing a semiconductor device according to the embodiments includes a forming an amorphous film on an insulating film, forming a conductive film on the amorphous film, performing a heat treatment at a first temperature to the amorphous film and the conductive film to form a seed layer between the amorphous film and the conductive film, and after performing the heat treatment at the first temperature, performing a heat treatment at a second temperature higher than the first temperature to the amorphous film to form a ferroelectric film. The material of the first seed layer includes at least one material of the ferroelectric film and at least one material of the first conductive film.

A semiconductor device and a method of manufacturing the semiconductor device according to the embodiment, the characteristics of the semiconductor device can be improved.

BRIEF DESCRIPTION OF THE DRAWINGS

FIG. 3 is a table showing an exemplary voltage applied to respective portions of the semiconductor device according to the first embodiment in each of a write operation, an erase operation, and a read operation.

FIG. 24 is a table showing an exemplary voltage applied to respective portions of the semiconductor device according to the second embodiment in each of a write operation, an erase operation, and a read operation.

DETAILED DESCRIPTION

Figure 1:
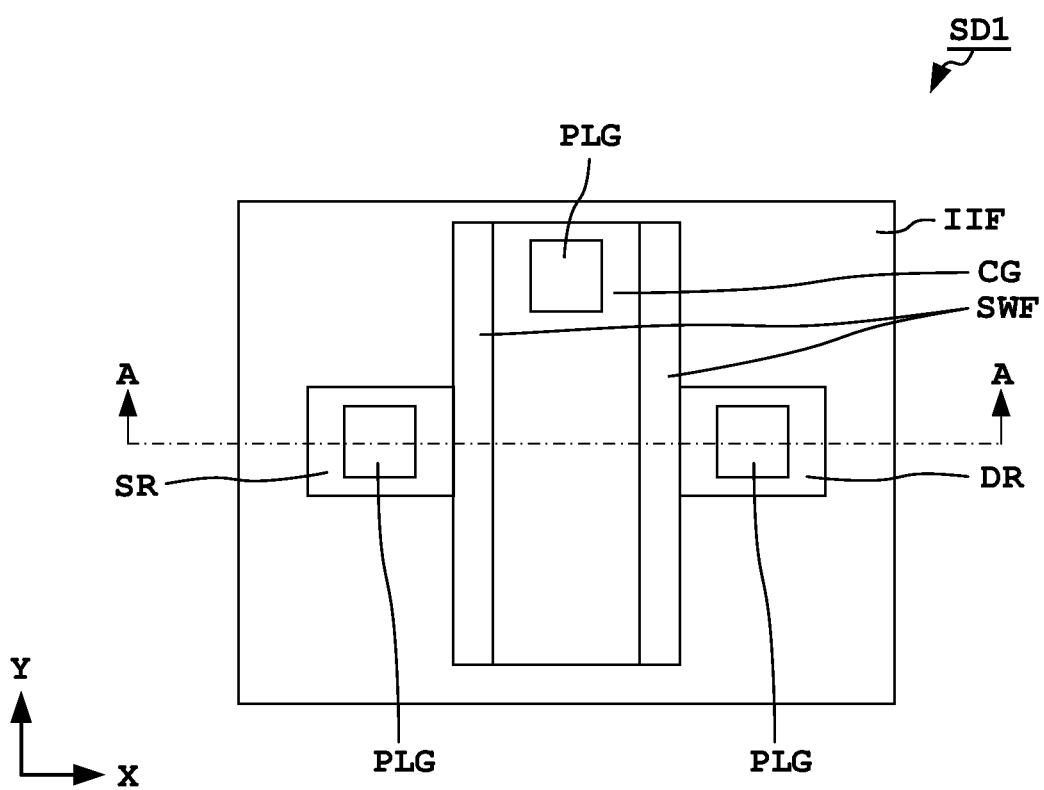
FIG. 1 is a plan view illustrating an exemplary configuration of a main portion of a semiconductor device according to a first embodiment.

Hereinafter, a semiconductor device according to embodiments will be described in detail by referring to the drawings. In the specification and drawings, the same or corresponding elements are denoted by the same reference numerals or hatching, and a repetitive description thereof is omitted. In the drawings, for convenience of description, a configuration may be omitted or simplified. In addition, a cross-sectional view may be shown as an end view from the viewpoint of visibility.

First Embodiment

A semiconductor device SD1 according to a first embodiment includes a first seed layer SL1 formed on an upper surface of a ferroelectric film FEF.

(Configuration of Semiconductor Device)

Figure 2:
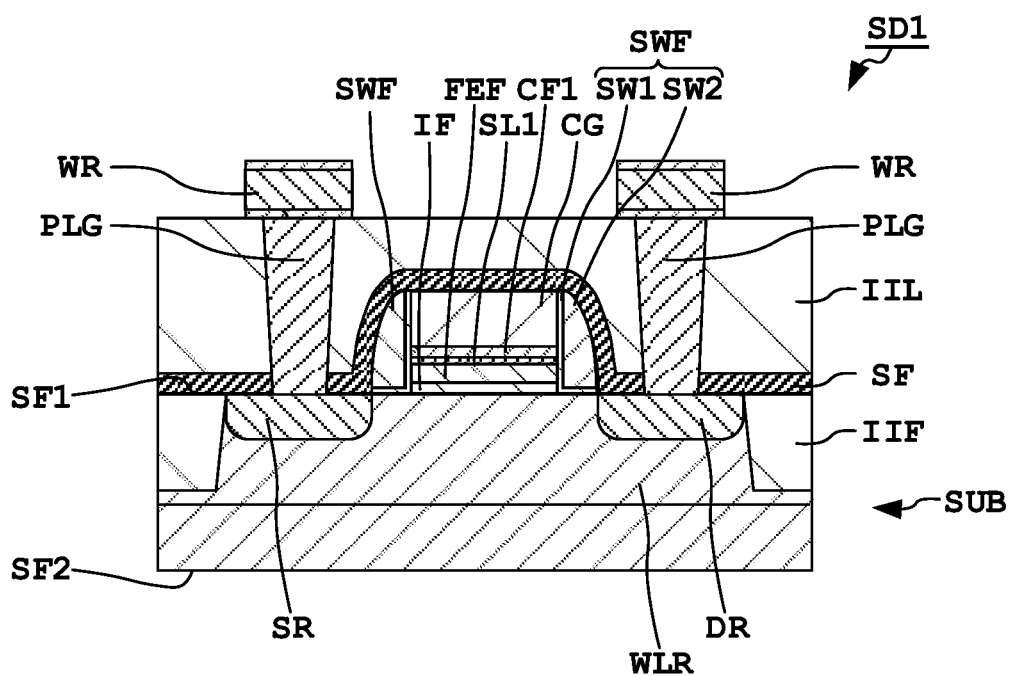
FIG. 2 is a cross-sectional view illustrating an exemplary configuration of the main portion of the semiconductor device according to the first embodiment.

FIG. 1 is a plan view illustrating an exemplary configuration of a main portion of the semiconductor device SD1. FIG. 2 is a cross-sectional view showing an exemplary configuration of the main portion of the semiconductor device SD1. FIG. 2 is the cross-sectional view taken along line A-A of FIG. 1.

The semiconductor device SD1 includes a semiconductor substrate SUB, an isolation insulating film IIF, an insulating film IF, a ferroelectric film FEF, a first seed layer SL1, a first conductive film CF1, a control gate electrode CG, a pair of sidewall insulating films SWF, a stress film SF, an interlayer insulating layer IIL, a plug PLG and a wiring WR. In FIG. 1, the stress film SF, the interlayer insulating layer IIL and the wiring WR are omitted from the viewpoint of visibility.

The semiconductor substrate SUB has a first surface (main surface) SF1, and a second surface SF2 opposite the first surface SF1. The first surface SF1 of the semiconductor substrate SUB, semiconductor elements such as a transistor, a resistor and a capacitor may be formed. In the first embodiment, a ferroelectric memory cell is formed on the first surface SF1 of the semiconductor substrate SUB. A type of semiconductor substrate SUB is, for example, silicon-single-crystal substrate. A resistivity of the semiconductor substrate SUB, for example, 1 Ω·cm or more and 10 Ω·cm or less.

The first surface SF1 of the semiconductor substrate SUB, a well region WLR, a source region SR, a drain region DR and the isolation insulating film IIF are formed. The well region WLR, the source region SR, and the drain region DR constitute a part of the ferroelectric memory cell.

The well region WLR directly contacts with the source region SR and the drain region DR. In the first surface SF1, a part of the well region WLR is formed between the source region SR and the drain region DR. Another part of the well region WLR, in plan view, overlaps with the source region SR and the drain region DR. The well region WLR includes a predetermined concentration of impurities.

The source region SR and the drain region DR are spaced apart from each other. Each of the source region SR and the drain region DR includes an impurity of a predetermined concentration. From the viewpoint of reducing a contact resistance with the plug, a silicide layer may be formed on an upper surface of each of the source region SR and the drain region DR. A material of the silicide layer is, for example, cobalt silicide, nickel silicide, platinum silicide, or nickel platinum silicide. Each of the source region SR and the drain region DR may include so-called Lightly Doped Drain (LDD) region. In plan view, the LDD region is formed at a position in which the side wall insulating film SWF overlaps with the LDD region.

The isolation insulating film IIF, in plan view, surrounds the region that functions as the ferroelectric memory cell. The isolation insulating film IIF, in plan view, is formed such that the isolation insulating film IIF surrounds a region (a part of the well region WLR) sandwiched between the source region SR and the drain region DR, the source region SR, and the drain region SR. The isolation insulating film IIF is formed on the first surface SF1 of the semiconductor substrate SUB. A material of the isolation insulating film IIF is, for example, silicon oxide.

The insulating film IF suppresses electrons from being unintentionally introduced into the ferroelectric film FEF from the semiconductor substrate SUB while the semiconductor device SD is operating. The insulating film IF is formed on the first surface SF1 of the semiconductor substrate SUB. The insulating film IF, in plan view, is formed such that the insulating film IF is positioned between the source region SR and the drain region DR. A part of the insulating film IF may be formed on the isolation insulating film IIF.

The insulating film IF may be a single-layer film or a stacked-layer film. In present embodiment, the insulating film IF is a single-layer film made of, for example, a silicon oxide film. When the insulating film IF is a multi-layer film, the insulating film IF is, for example, a stacked-layer film including a silicon oxide film and hafnium oxide film. The hafnium oxide film is formed on the silicon oxide film. A thickness of the insulating film IF is, for example, 1 nm or more and 3 nm or less.

The ferroelectric film FEF is formed on the insulating film IF. A thickness of the ferroelectric film FEF is, for example, 5 nm or more and 20 nm or less. The ferroelectric film FEF may be a single layer film or a stacked-layer film. In present embodiment, the ferroelectric film FEF is a single-layer film.

A material of the ferroelectric film FEF is ferroelectric. The ferroelectric has a characteristic that when an electric field is applied, dielectric polarization occurs, and thereafter, even if the application of the electric field is eliminated, the polarization state is maintained. A crystal structure of the ferroelectric film FEF is mainly rectangular. Thus, the characteristics of the ferroelectric is obtained. The crystal structure of the ferroelectric film FEF, when not rectangular, the characteristics of the paramagnetic is expressed, it is impossible to obtain the desired characteristics as a ferroelectric memory. The material of the ferroelectric film FEF has a higher dielectric constant than silicon nitride. For example, the material of the ferroelectric film FEF includes hafnium (Hf) and oxygen (O). That is, the ferroelectric film FEF is a hafnium oxide film. The ferroelectric film FEF may further include zirconium (Zr), silicon (Si), germanium (Ge), yttrium (Y), lanthanum (La), or ytterbium (Yb).

The ferroelectric film FEF preferably further includes a crystallization promotor. The crystallization promoter, in crystallization (forming the ferroelectric film FEF), functions as a nucleus, to promote the crystallization of the ferroelectric film FEF. The crystallize promotor is, for example, aluminum (Al), carbon (C) or fluorine (F) The crystallization promotor may be uniformly included in the ferroelectric film FEF as a whole or partially included in the ferroelectric film FEF. When the crystallization promoter is partially included in the ferroelectric film FEF, the crystallization promoter, in a thickness direction of the ferroelectric film FEF, preferably is dispersed in a vicinity of the center of the ferroelectric film FEF. As a result, crystallization is promoted uniformly in the ferroelectric film FEF as a whole.

The first seed layer SL1 is formed on an upper surface of the ferroelectric film FEF. The first seed layer SL1 is sandwiched between the ferroelectric film FEF and the first conductive film CF1. That is, the first seed layer SL1 directly contacts with the ferroelectric film FEF and the first conductive film CF1. From the viewpoint of uniformly promoting the crystallization of the ferroelectric film FEF, the first seed layer SL1 is preferably formed on an entirety of the upper surface of the ferroelectric film FEF.

It is preferable that the first seed layer SL1 includes at least one of material of the ferroelectric film FEF (in present embodiment, oxygen) and at least one of material of the first conductive film CF1 (in present embodiment, titanium). Thus, the first seed layer SL1 can increase the bonding strength between the ferroelectric film FEF and the first conductive film CF1. In addition, the first seed layer SL1 functions as a nucleus in the crystallization step and promotes crystallization. Therefore, compared with a lattice constant of the material of the first conductive film CF1, a lattice constant of the material of the first seed layer SL1 is preferably close to a lattice constant of the material of the ferroelectric film FEF (rectangular crystal system). A material of the first seed layer SL1 includes at least one selected from the first group consisting of titanium, iridium, aluminum, iron, calcium, ruthenium, strontium, lanthanum, nickel and cobalt, and at least one selected from the second group consisting of oxygen and nitrogen. A material for the first seed layer SL1 is, for example, titanium oxide, Iridium oxide, ruthenium oxide, aluminum oxide, iron oxide, $CaRuO_3$, $SrIrO_3$, $LaNiO_3$ or $LaCaCoO_3$.

For example, when the material of the ferroelectric film FEF is hafnium oxide and the material of the first conductive film CF1 is titanium nitride, the material of the first seed layer SL1 includes titanium and oxygen. The material of the first seed layer SL1 may further include nitrogen. For example, the material of the first seed layer SL1 is one or both of titanium oxide and titanium oxynitride.

The material of the first seed-layer SL1 may have a lattice constant close to twice the lattice constant of the material of the ferroelectric film FEF (rectangular crystal system). In this instance, the material of the first seed layer SL1 is, for example, indium oxide, yttrium oxide, erbium oxide, ytterbium oxide, or lutetium oxide.

A thickness of the first seed layer SL1 is not particularly limited as long as the above-mentioned function can be obtained. From the viewpoint of enhancing the crystallization promoting effect, it is preferable that the thickness of the first seed layer SL1 is large. From such viewpoint, the thickness of the first seed layer SL1 is preferably 0.5 nm or more, and more preferably 2 nm or more. On the other hand, if the resistance of the first seed layer SL1 is large, the first seed layer SL1 may be a capacitive element between the ferroelectric film FEF and the first conductive film CF1. The capacitive element connected in series with the ferroelectric film FEF reduces the voltage divided into the ferroelectric film FEF. Therefore, it is preferable that the above-mentioned capacitive element is small. From the viewpoint of reducing the capacitive element, it is preferable that a thickness of the first seed layer SL1 is small. It is preferable that the thickness of the first seed layer SL1 is smaller than, for example, a thickness of each of the ferroelectric film FEF and the first conductive film CF1. From such viewpoint, the thickness of the first seed layer SL1 is preferable 2 nm or less, more preferably 0.5 nm or less.

The first conductive film CF1 is formed on the first seed layer SL1. The first conductive film CF1 stresses the ferroelectric film FEF to control an orientation of the crystal of the ferroelectric film FEF in the manufacturing process of the semiconductor device SD1. From the viewpoint of uniformly controlling the orientation of the crystal of the ferroelectric film FEF, it is preferable that the first conductive film CF1 is directly or indirectly formed on an entirety of the upper surface of the ferroelectric film FEF.

When the orientation of the crystal of the ferroelectric film FEF is strongly controlled to such an extent that the orientation of the crystal of the ferroelectric film FEF remains even if the first conductive film CF1 is removed, the semiconductor device SD1 may not include the first conductive film CF1. From the viewpoint of reducing variations in the orientation of the ferroelectric film FEF, it is preferable that the semiconductor device SD1 includes the first conductive film CF1.

The thickness of the first conductive film CF1 is, for example, 10 nm or more and 20 nm or less. The material of the first conductive film CF1 includes, for example, titanium, tantalum, or tungsten, and nitrogen. The material of the first conductive film CF1 is, for example, a binary alloy of titanium, titanium nitride, aluminum, iron, calcium and ruthenium, a binary alloy of strontium and iridium, a binary alloy of lanthanum and nickel, and a ternary alloy of lanthanum, calcium, and cobalt.

The control gate electrode CG has conductivity. A thickness of the control gate electrode CG is, for example, 60 nm or more and 150 nm or less. The material of the control gate electrode CG is, for example, polycrystalline silicon having conductivity.

A pair of sidewall insulating films SWF is formed on the first surface SF1 of the semiconductor substrate SUB such that the pair of sidewall insulating films SWF sandwiches a first structure including the insulating film IF, the ferroelectric film FEF, the first seed layer SL1, the first conductive film CF1 and the control gate electrode CG. The sidewall insulating film SWF may be a single layer film or a stacked-layer film. In present embodiment, the sidewall insulating film SWF is a stacked-layer film including a first sidewall insulating film SW1 and a second sidewall insulating film SW2. The first sidewall insulating film SW1, in cross-sectional view, includes a first part extending along the main surface of the semiconductor substrate SUB, and a second part extending along a normal of the main surface of semiconductor substrate SUB. The first part is formed on the first surface SF1 of the semiconductor substrate SUB. The second part is formed on a side surface (sidewall) of the first structure. The second sidewall insulating film SW2 is formed on the first sidewall insulating film SW1. A material of the sidewall insulating film SWF is silicon oxide or silicon nitride. For example, the first sidewall insulating film SW1 is a silicon nitride film, and the second sidewall insulating film SW2 is a silicon oxide film.

The stress film SF is formed on the semiconductor substrate SUB such that the stress film SF covers a second structure including the insulating film IF, the ferroelectric film FEF, the seed layer SL, the first conductive film CF1, the control gate electrode CG and the pair of sidewall insulating films SWF. The stress film SF has tensile stress or compressive stress. The stress film SF applies stress to the second structure. The stress film SF applies stress to a part of the semiconductor substrate SUB located between the source region SR and the drain region DR. Thus, it is possible to increase a mobility of carriers flowing between the source region SR and the drain region DR. A material of the stress film SF is, for example, silicon nitride.

The interlayer insulating layer IIL is formed on the first surface SF1 of the semiconductor substrate SUB such that the interlayer insulating layer IIL covers the second structure through the stress film SF. A material for the interlayer insulating layer IIL is, for example, silicon oxide.

The plug PLG is formed in the interlayer insulating layer IIL such that the plug PLG reaches the source region SR, the drain region DR or the control gate electrode CG. The material of the plug PLG is, for example, tungsten.

The wiring WR is formed on the interlayer insulating layer IIL. The wiring WR is electrically connected to each of the source region SR, the drain region DR or the control gate electrode CG through the plug PLG. The wiring WR, for example, is a stacked-layer film in which a first barrier metal film, a conductive film and a second barrier metal film are stacked in this order. An example of a material of the first barrier metal film and the second barrier metal film include titanium (Ti), tantalum (Ta), titanium nitride (TiN), and tantalum nitride (TaN). The material of the conductive film is, for example, aluminum, copper, or tungsten.

(Operation of Semiconductor Device)

Next, the operation of the semiconductor device SD1 is explained. Here, the operation of one ferroelectric memory cell constituting the semiconductor device SD1 will be described. Hereinafter, a write operation, an erase operation, and a read operation will be described, respectively.

FIG. 3 is a table showing examples of voltages applied to respective portions of the semiconductor device SD1 in the write operation, the erase operation, and the read operation, respectively. In FIG. 3, Vs indicates a voltage applied to the source region SR. Vd indicates a voltage applied to the drain region DR. Vg indicates a voltage applied to the control gate electrode CG. Vw indicates a voltage applied to the well region WLR.

Here, a case where the polarization state of the ferroelectric film FEF is a first polarization state (upward) is referred to as a "write state". In addition, a case in which the polarization state of the ferroelectric film FEFs is a second polarization state (downward) that differs from the first polarization state will be described as an "erase state." A threshold voltage of the ferroelectric memory cell in the write state is assumed to be greater than a threshold voltage of the ferroelectric memory cell in the erase state.

(Write Operation)

A negative voltage $-V_{EC}$ is applied to the control gate electrode CG while a voltage of the same magnitude is applied to the source region SR and the drain region DR. Thus, the polarization state of the ferroelectric film FEF becomes the first polarization state. That is, the state of the ferroelectric memory cell is a write state. The voltage $V_{EC}$ is, for example, 3 V. The voltage of each of the source region SR, the drain region DR and the well region WLR, for example, 0 V.

(Erasing Operation)

A positive voltage $V_{EC}$ is applied to the control gate electrode CG while a voltage of the same magnitude is applied to the source region SR and the drain region DR. Thus, the polarization state of the ferroelectric film FEF becomes the second polarization state. That is, the ferroelectric memory cell is in an erased state. A voltage of each of the source region SR, the drain region DR and the well region WLR, for example, 0 V.

(Read Operation)

A bias is applied between the source region SR and the drain region DR. For example, a voltage $V_{dd}$ is applied to the source region SR, and potentials of the control gate electrode CG, the drain region DR, and the well region WLR are set to 0 V. The voltage $V_{dd}$ is, for example, 1 V. The voltage $V_{dd}$ is set to be greater than the threshold voltage of the ferroelectric memory cell in the erase state and smaller than the threshold voltage of the ferroelectric memory cell in the write state. As a result, no current flows in the ferroelectric memory cell in the write state, and current flows in the ferroelectric memory cell in the erase state. In this manner, a state of the ferroelectric memory cell is read out based on the magnitude of the current value flowing in the ferroelectric memory cell.

(Method of Manufacturing Semiconductor Device)

Figure 17:
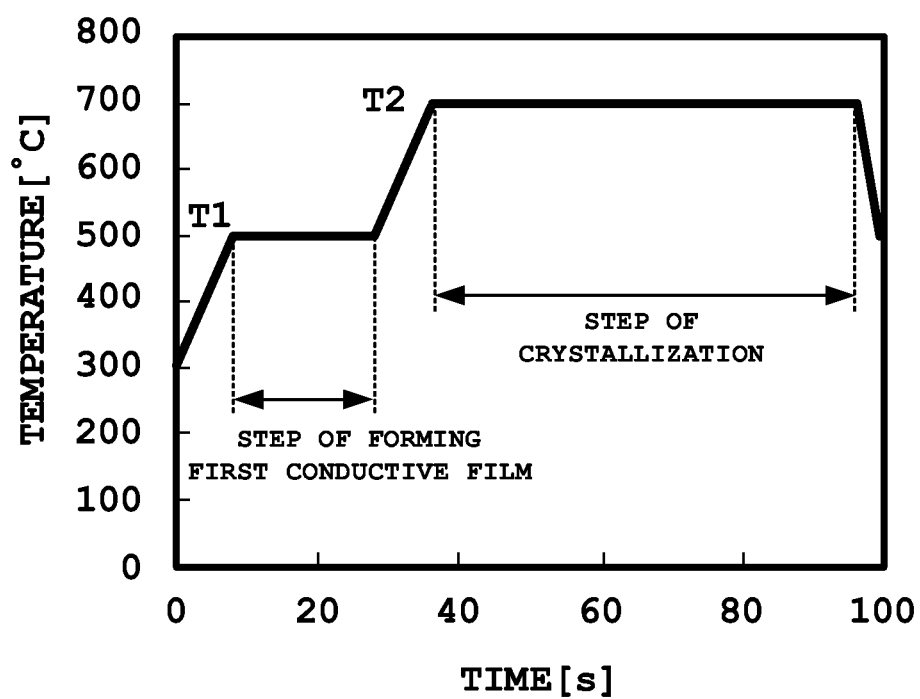
FIG. 17 is a graph schematically showing a temperature sequence in the forming a first seed layer and in crystallization.
Figure 18:
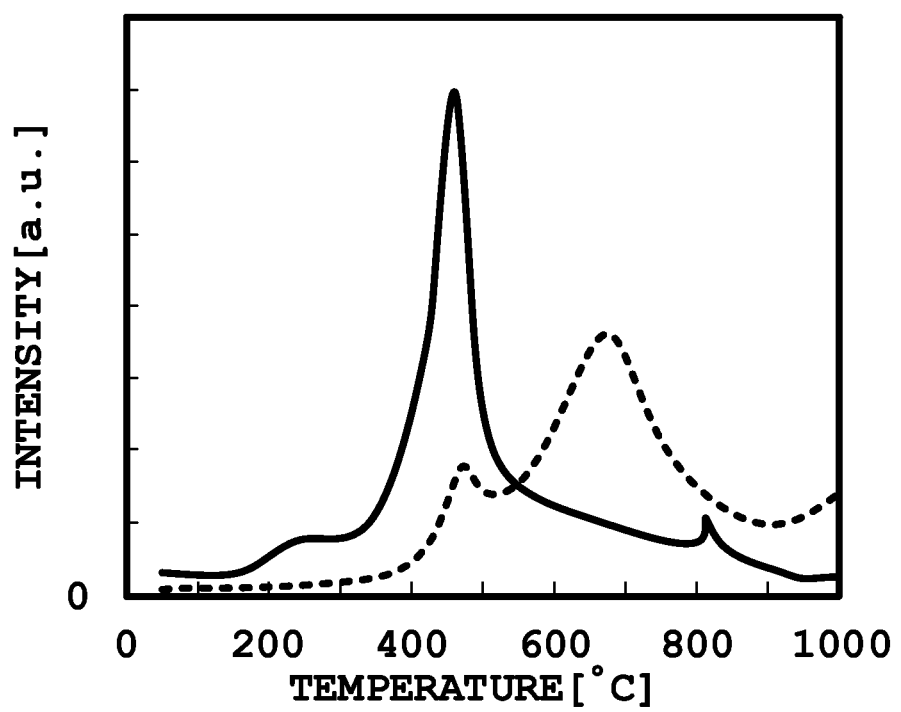
FIG. 18 is a graph showing a relationship between a heating temperature of an amorphous film, a desorption amount of water desorbing from the amorphous film and a desorption amount of hydrogen desorbing from the amorphous film.

Next, an exemplary method of manufacturing the semiconductor device SD1 according to the first embodiment will be described. FIGS. 4 to 16 are cross-sectional views showing exemplary steps included in the method of manufacturing the semiconductor device SD1. FIG. 17 is a graph schematically showing thermal sequence in the forming the first seed layer SL1 and the crystallization. FIG. 18 is a graph showing the relationship between the heating temperature of an amorphous film AMF, a desorption amount of water desorbing from the amorphous film AMF and a desorption amount of hydrogen desorbing from the amorphous film AMF. In FIG. 18, a solid line indicates the amount of water desorption and a dashed line indicates the amount of hydrogen desorption.

The method of manufacturing the semiconductor device SD1 according to the first embodiment includes (1) providing a semiconductor wafer SW, (2) forming the insulating film IF, (3) forming the amorphous film AMF, (4) forming the first conductive film CF1, (5) forming the first seed layer SL1, (6) crystallizing, (7) forming the control gate electrodes CG, (8) patterning, (9) forming the sidewall insulating film SWF, (10) forming the stress film SF, (11) forming the source region SR and the drain region DR, (12) forming the interlayer insulating layer IIL, and (13) forming the plug PLG and the wiring WR.

(1) Providing of a Semiconductor Wafer SW

Figure 4:
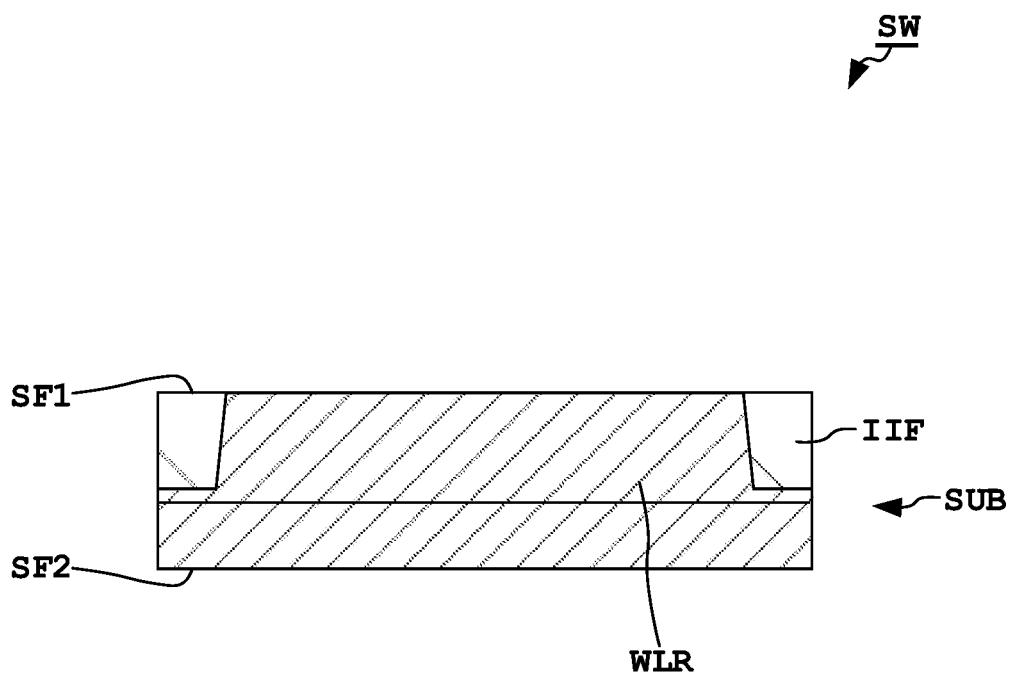
FIG. 4 is a cross-sectional view illustrating an exemplary step included in a method of manufacturing the semiconductor device according to the first embodiment.

First, as shown in FIG. 4, a semiconductor wafer SW is provided. The semiconductor wafer SW according to the first embodiment, includes the semiconductor substrate SUB in which the well region WLR and the isolation insulating film IIF are formed on the first surface SF1 of the semiconductor substrate SUB. The semiconductor wafer SW may be manufactured or purchased as a commercial product. The semiconductor wafer SW is, for example, a silicon wafer. For example, the silicon wafer purchased as a commercial product, the well region WLR and the isolation insulating film IIF may be formed.

A method of forming the well region WLR is not particularly limited. For example, the well region WLR is formed by ion implantation and activation annealing.

A method of forming the isolation insulating film IIF is not particularly limited. For example, the isolation insulating film IIF may be formed by burying an insulating film in a recess portion formed on the semiconductor substrate SUB. Further, the isolation insulating film IIF may be formed by oxidizing a portion of the first surface SF1 of the semiconductor substrate SUB by LOCOS method.

(2) Forming the Insulating Film IF

Figure 5:
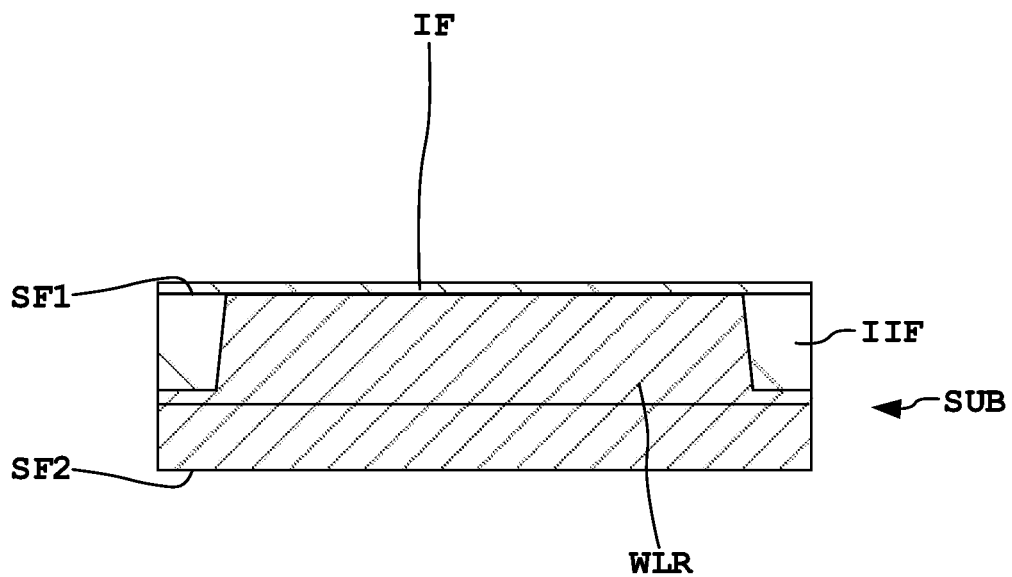
FIG. 5 is a cross-sectional view illustrating an exemplary step included in the method of manufacturing the semiconductor device according to the first embodiment.

Subsequently, as shown in FIG. 5, the insulating film IF is formed on the first surface SF1 of the semiconductor substrate SUB. The insulating film IF is formed by, for example, a chemical vapor deposition (CVD) method. In this step, the insulating film IF is not patterned, and is formed on an entirety of the first surface SF1 of the semiconductor substrate SUB.

(3) Forming an Amorphous Film AMF

Figure 6:
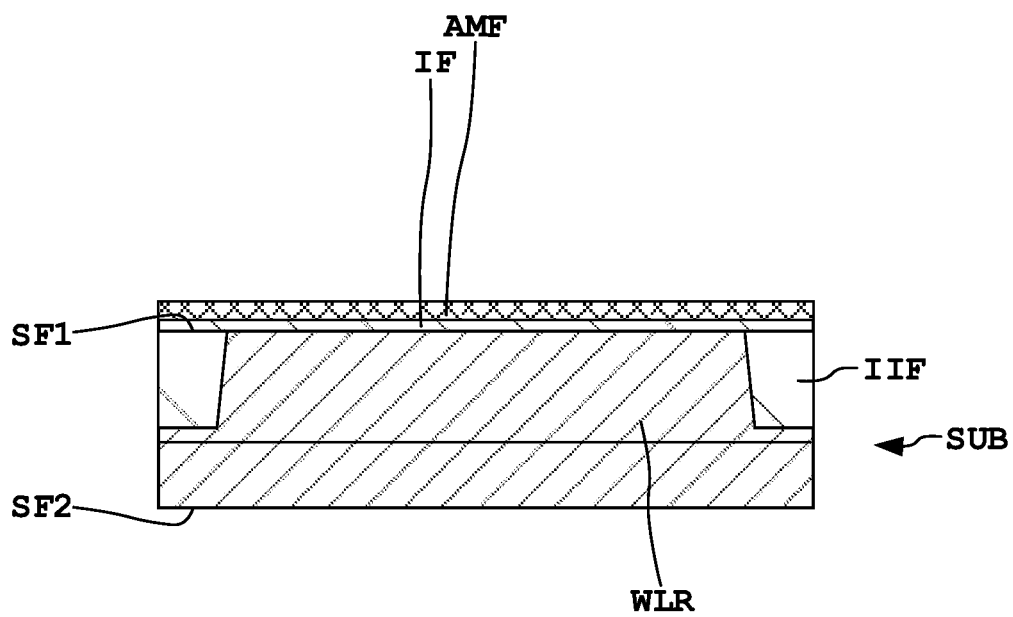
FIG. 6 is a cross-sectional view illustrating an exemplary step included in the method of manufacturing the semiconductor device according to the first embodiment.

Subsequently, as shown in FIG. 6, an amorphous film AMF is formed on the insulating film IF. The amorphous film AMF is the ferroelectric film FEF before being crystallized. The amorphous film AMF is formed by, for example, an Atomic Layer Deposition (ALD) method.

When the crystallization promotor is added to the amorphous film AMF, after a first amorphous film is formed, the crystallization promotor may be formed on the first amorphous film by, for example, a sputtering method. In this instance, after forming the crystallization promotor, a second amorphous film is formed on the first amorphous film. Further, after forming the amorphous film AMF, for example, the crystallization promotor may be formed in the amorphous film AMF by an ion implantation method.

(4) Forming the First Conductive Film CF1

Figure 7:
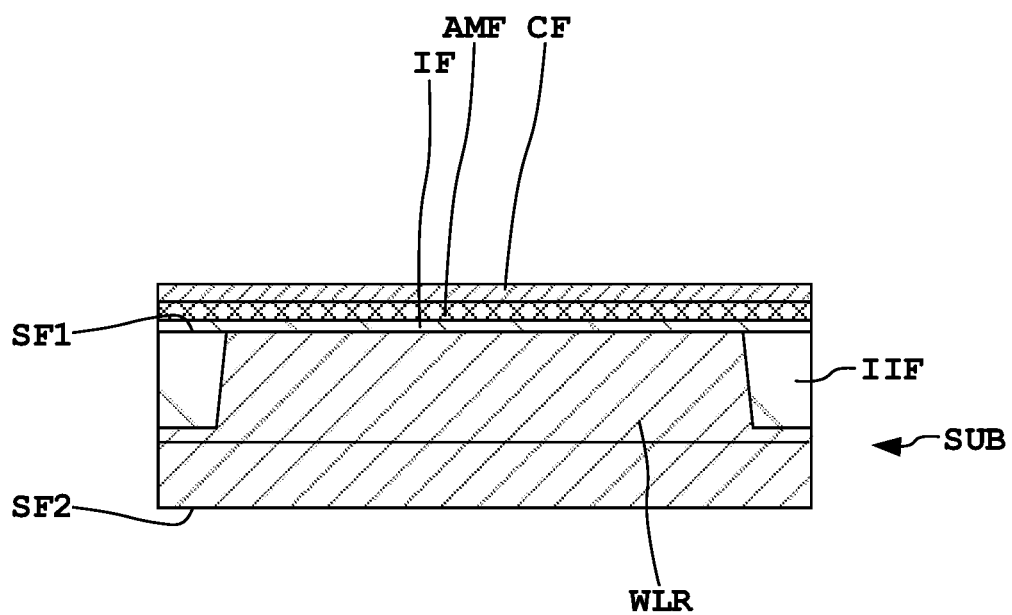
FIG. 7 is a cross-sectional view illustrating an exemplary step included in the method of manufacturing the semiconductor device according to the first embodiment.

Subsequently, as shown in FIG. 7, the first conductive film CF1 is formed on the amorphous film AMF. A method of forming the first conductive film CF1 is, for example, a sputtering method. In this step, the first conductive film CF1 is not patterned, and is formed on an entirety of the amorphous film AMF.

(5) Forming the First Seed Layer SL1

Figure 8:
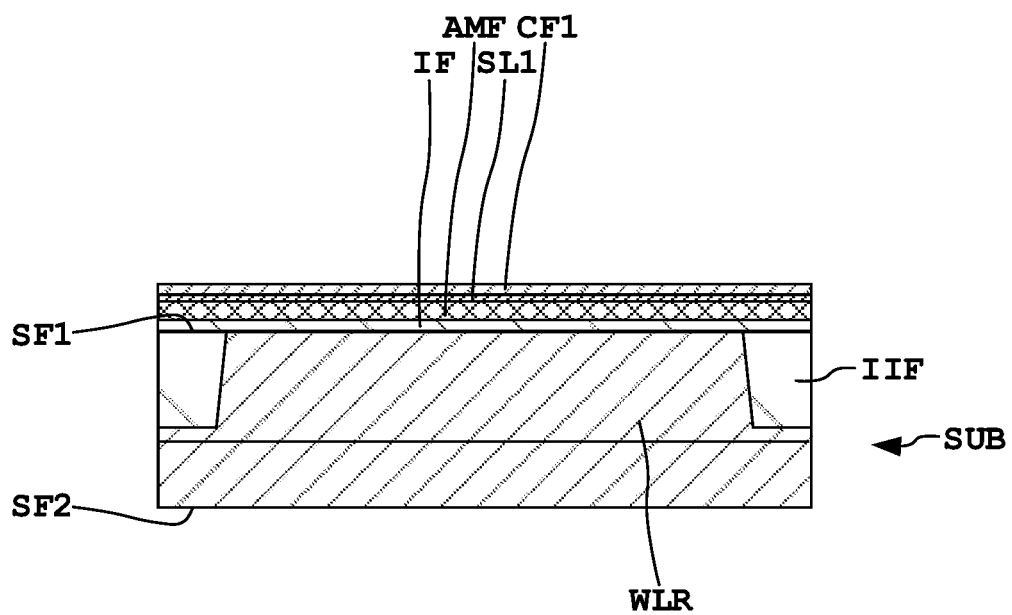
FIG. 8 is a cross-sectional view illustrating an exemplary step included in the method of manufacturing the semiconductor device according to the first embodiment.

Subsequently, as shown in FIG. 8, the first seed layer SL1 is formed between the amorphous layer AMF and the first conductive film CF1. Specifically, as shown in FIG. 17, the heat treatment at the first temperature T1 is performed to the amorphous film AMF and the first conductive film CF1. Here, the first temperature T1 is a set temperature when performing the heat treatment. The first temperature T1 is a temperature at which water and hydrogen are desorbed from the amorphous film AMF. As a result, the first conductive film CF1 is reduced by the hydrogen and oxidized by the water. Consequently, a first seed layer SL1 is formed between the ferroelectric film FEF and the first conductive film CF1.

At this instance, it is preferable that the amount of water desorbed is greater than the amount of hydrogen desorbed. This is because when the amount of hydrogen desorption is greater than the amount of water desorbed, a reduction reaction is accelerated more than an oxidation reaction, and as a result, the formation of the first seed layer SL1 is not sufficiently promoted. From such viewpoint, the first temperature T1 is preferably 300° C. or more and 550° C. or less, more preferably 400° C. or more and 500° C. or less (see FIG. 18).

The first temperature T1 is particularly not limited long as the first seed layer SL1 can be formed, and is appropriately set in accordance with the material of the ferroelectric film FEF and the material of the first conductive film CF1. The first temperature T1 may be a constant temperature or a varying temperature as long as it is lower than a predetermined temperature. For example, the first temperature T1 may be changed at a predetermined temperature rising rate.

A first heat time of the heat treatment at the first temperature T1 is appropriately adjusted in accordance with a desired thickness of the first seed layer SL1. For example, the first heat time is 10 seconds or more and 25 seconds or less.

(6) Crystallizing

Figure 9:
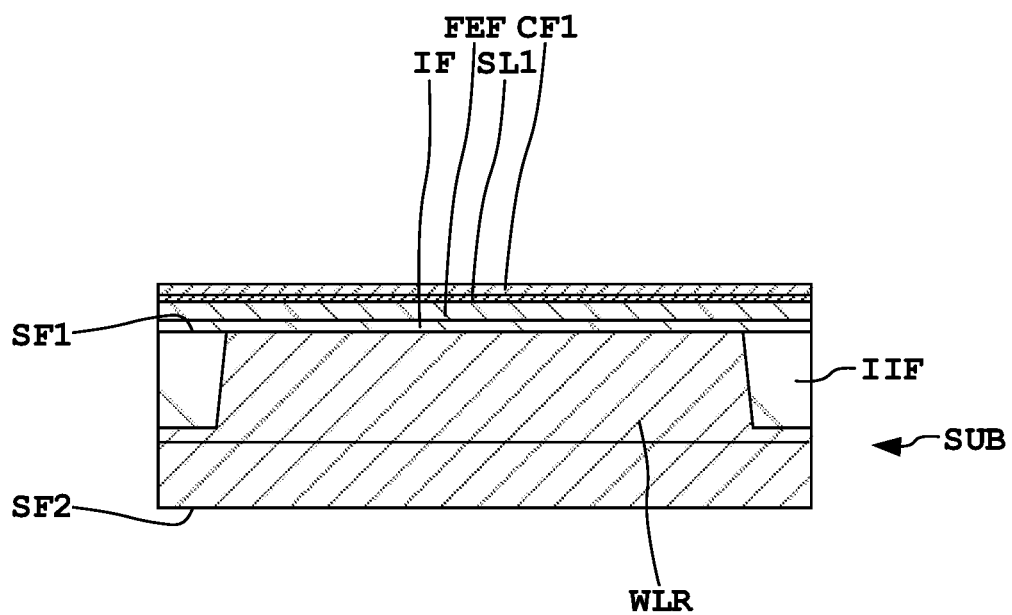
FIG. 9 is a cross-sectional view illustrating an exemplary step included in the method of manufacturing the semiconductor device according to the first embodiment.

Subsequently, the amorphous film AMF is crystallized to form the ferroelectric film FEF, as shown in FIG. 9. Specifically, as shown in FIG. 17, a heat treatment at a second temperature T2 is performed to the amorphous film AMF. Here, the second temperature T2 is a set temperature when performing the heat treatment. The second temperature T2 is greater than the first temperature T1. The second temperature T2 is particularly not limited as long as the amorphous film AMF can be crystallized into a rectangular crystal system. For example, the second temperature T2 is 600° C. or more and 800° C. or less. At this instance, when the second temperature T2 is more than 800° C. and 1000° C. or less, the crystal structure of the ferroelectric film FEF is likely to be monoclinic. As a result, the amorphous film AMF does not become a ferroelectric film, becomes a paraelectric film. The second temperature T2 may be a constant temperature or a varying temperature as long as it is a temperature greater than the first temperature T1. For example, the second temperature T2 may be changed at a predetermined temperature rising rate.

A second heat time of the heat treatment of the second temperature T2, the thickness of the amorphous film AMF (the ferroelectric film FEF), and is appropriately adjusted in accordance with conditions such as heating temperature. For example, the second heat time is 10 seconds or more and 90 seconds or less. It is preferable that the second heat time is longer than the first heat time from the viewpoint of that the thickness of the first seed layer SL1 layer formed by heat treatment at the first temperature T1 is formed thinner than the ferroelectric film FEF layer, and from the viewpoint of sufficiently promoting the formation and crystal growth of crystal nuclei of the ferroelectric film FEF film formed by heat treatment at second temperature T2.

In the first embodiment, crystallization is performed while the first seed layer SL1 is formed on the upper surface of the amorphous film AMF. The lattice constant of the first seed layer SL1 is close to the lattice constant of the ferroelectric film FEF having a rectangular crystal system, compared with the lattice constant of the first conductive film CF1. Therefore, crystallization of the amorphous film AMF is easily promoted as compared with a case where the first seed layer SL1 is not formed.

In the first embodiment, crystallization is performed while the first conductive film CF1 is formed on the amorphous film AMF through the first seed layer SL1. Therefore, the formation of the ferroelectric film FEF is further promoted by the stresses from the first conductive film CF1.

(7) Forming the Control Gate Electrode CG

Figure 10:
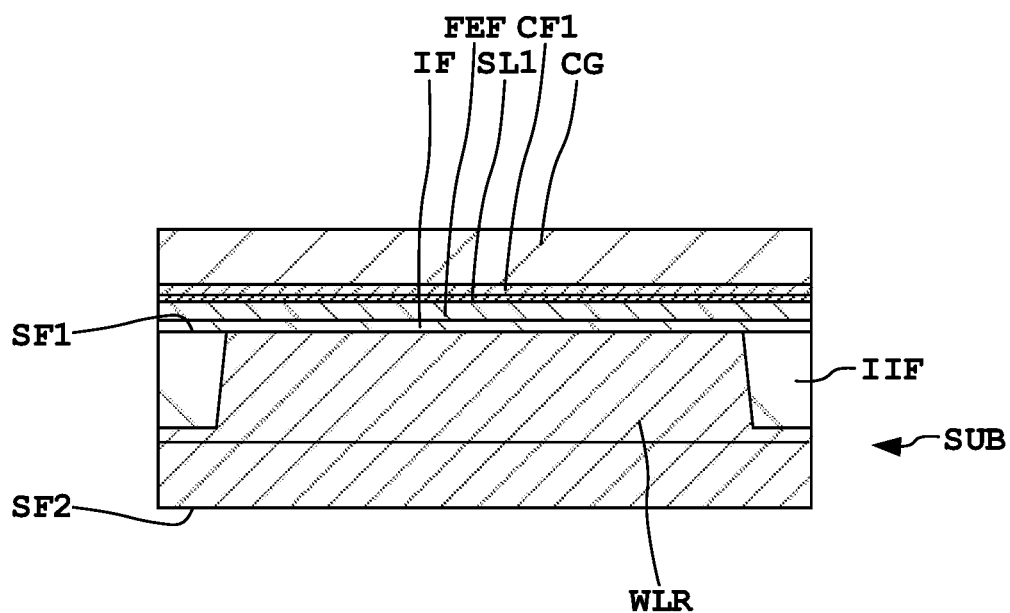
FIG. 10 is a cross-sectional view illustrating an exemplary step included in the method of manufacturing the semiconductor device according to the first embodiment.

Subsequently, the control gate electrode CG is formed on the first conductive film CF1 as shown in FIG. 10. The control gate electrodes CG is formed by, for example, CVD method.

(8) Patterning

Figure 11:
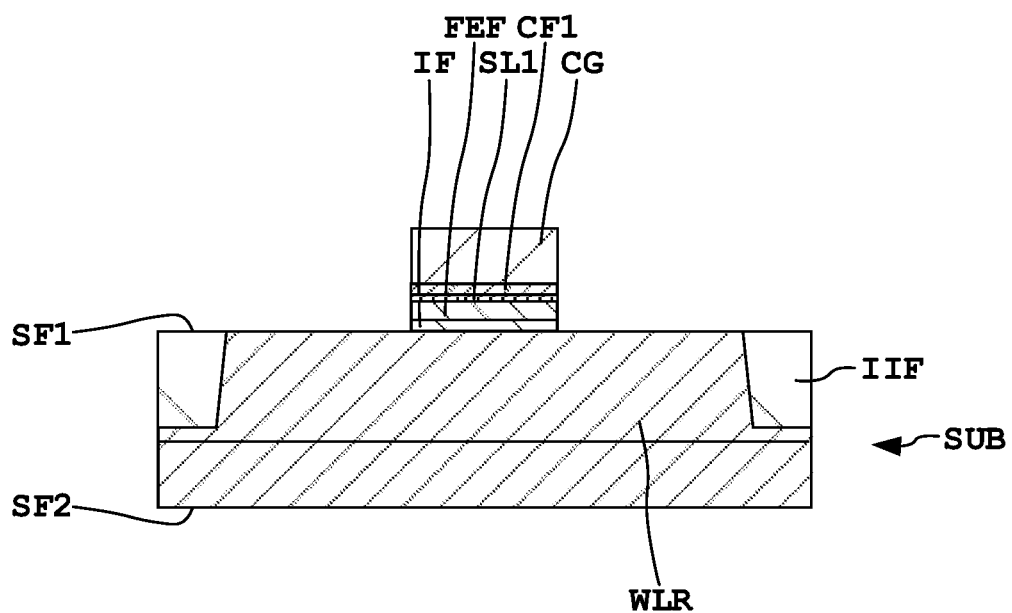
FIG. 11 is a cross-sectional view illustrating an exemplary step included in the method of manufacturing the semiconductor device according to the first embodiment.

Subsequently, as shown in FIG. 11, the first structure including the insulating film IF, the ferroelectric film FEF, the first seed layer SL1, the first conductive film CF1 and the control gate electrode CG is patterned so as to be a desired pattern. Patterning is performed, for example, by photolithography method and etching method. Although not shown in particular, a resist mask is formed on a region other than a region to be etched.

(9) Forming the Sidewall Insulating Film SWF

Figure 12:
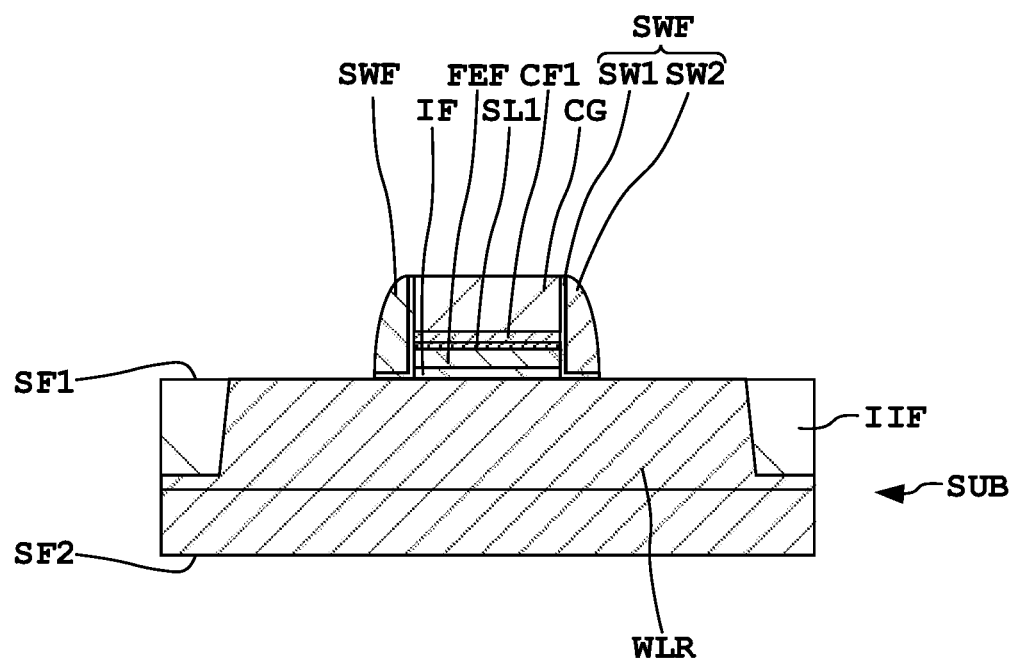
FIG. 12 is a cross-sectional view illustrating an exemplary step included in the method of manufacturing the semiconductor device according to the first embodiment.

Subsequently, as shown in FIG. 12, the pair of sidewall insulating films SWF is formed on the first surface SF1 of the semiconductor substrate SUB so as to sandwich the first structure including the insulating film IF, the ferroelectric film FEF, the first seed layer SL1, the first conductive film CF1 and the control gate electrode CG. A stacked-layer film including the first insulating film and the second insulating film is formed on the first surface SF1 of the semiconductor substrate SUB so as to cover the first structure, and then, a part of the stacked-layer film is removed, so that a part located on a sidewall of the first structure remains. The part of the stacked-layer film is removed by, for example, a photolithography method and an etching method.

(10) Forming the Stress Film SF

Figure 13:
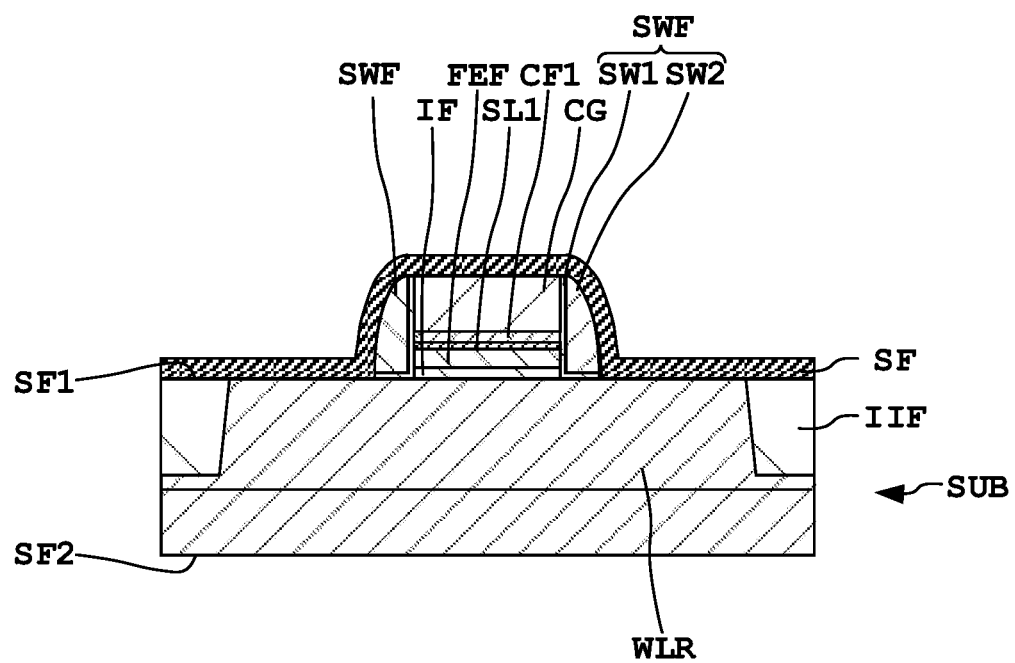
FIG. 13 is a cross-sectional view illustrating an exemplary step included in the method of manufacturing the semiconductor device according to the first embodiment.

Subsequently, as shown in FIG. 13, the stress film SF is formed on the first surface SF1 of the semiconductor substrate SUB so as to cover the second structure including the first structure and the pair of sidewall insulating films SWF. A method of forming the stress film SF is, for example, a CVD method. Subsequently, after the formation of the stress film SF, heat treatment may be performed. This causes stresses due to the stress film SF to be more effectively applied to the semiconductor substrate SUB, the second structures. Subsequently, the stress film SF may be removed after heat treatment.

(11) Forming the Source Region SR and the Drain Region DR

Figure 14:
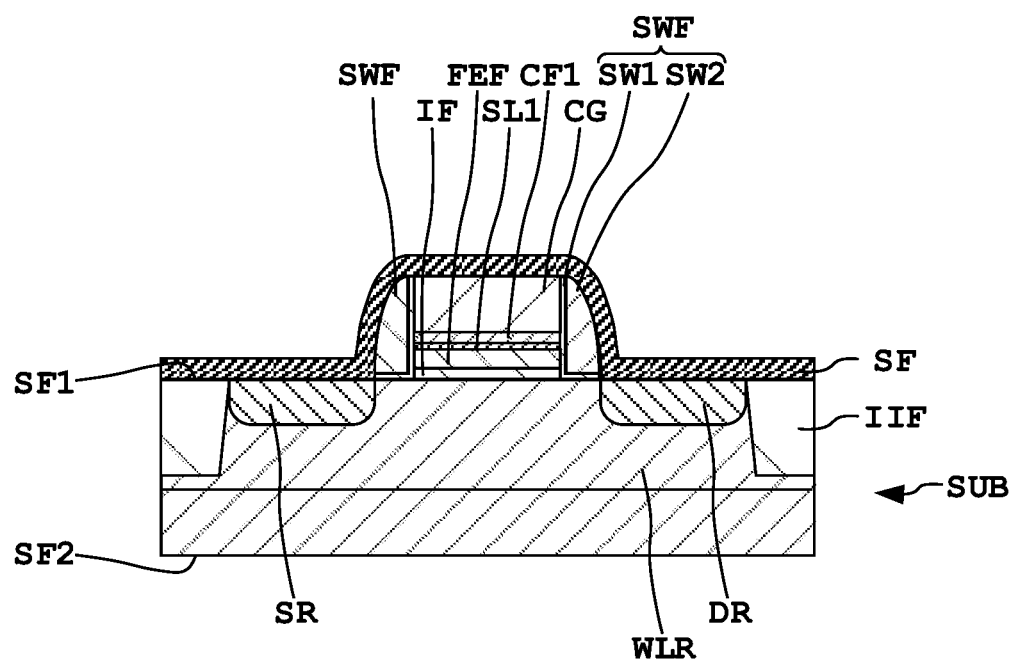
FIG. 14 is a cross-sectional view illustrating an exemplary step included in the method of manufacturing the semiconductor device according to the first embodiment.

Subsequently, as shown in FIG. 14, the source region SR and the drain region DR are formed on the first surface SF1 of the semiconductor substrate SUB. A method of forming the source region SR and the drain region DR is not particularly limited. For example, the source region SR and the drain region DR are formed by ion implantation and activation annealing. Note that, although not particularly shown, in the ion implantation method, a resist mask is formed on a region other than a region where ion implantation is to be performed.

(12) Forming the Interlayer Insulating Layer IIL

Figure 15:
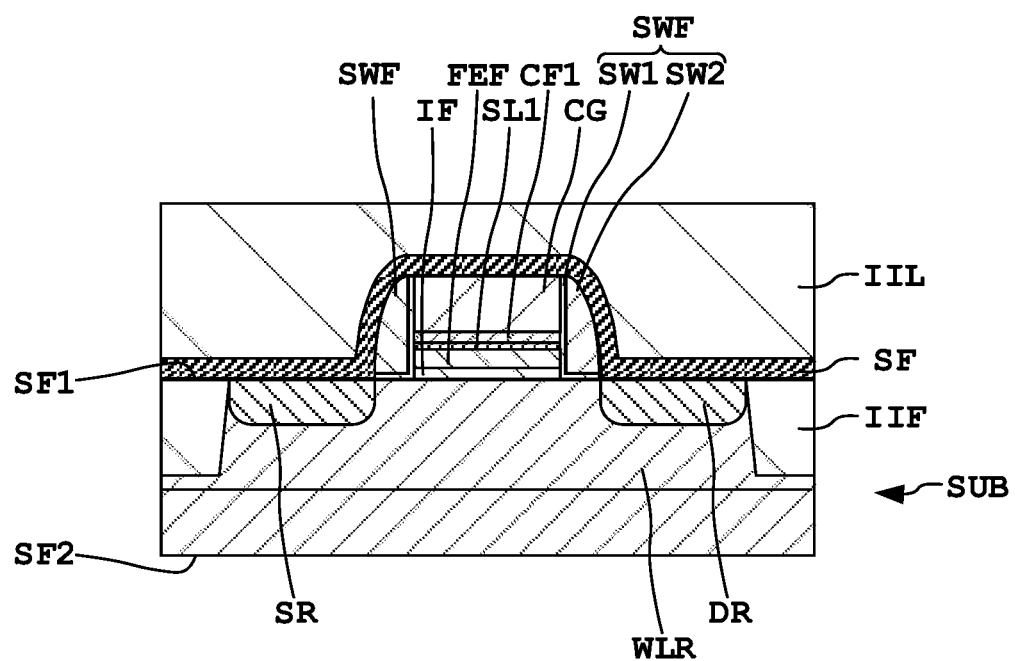
FIG. 15 is a cross-sectional view illustrating an exemplary step included in the method of manufacturing the semiconductor device according to the first embodiment.

Subsequently, as shown in FIG. 15, the interlayer insulating layer IIL is formed on the stress film SF. The method of forming the interlayer insulating layer IIL is, for example, a CVD method.

(13) Forming the Plug PLG and the Wiring WR

Figure 16:
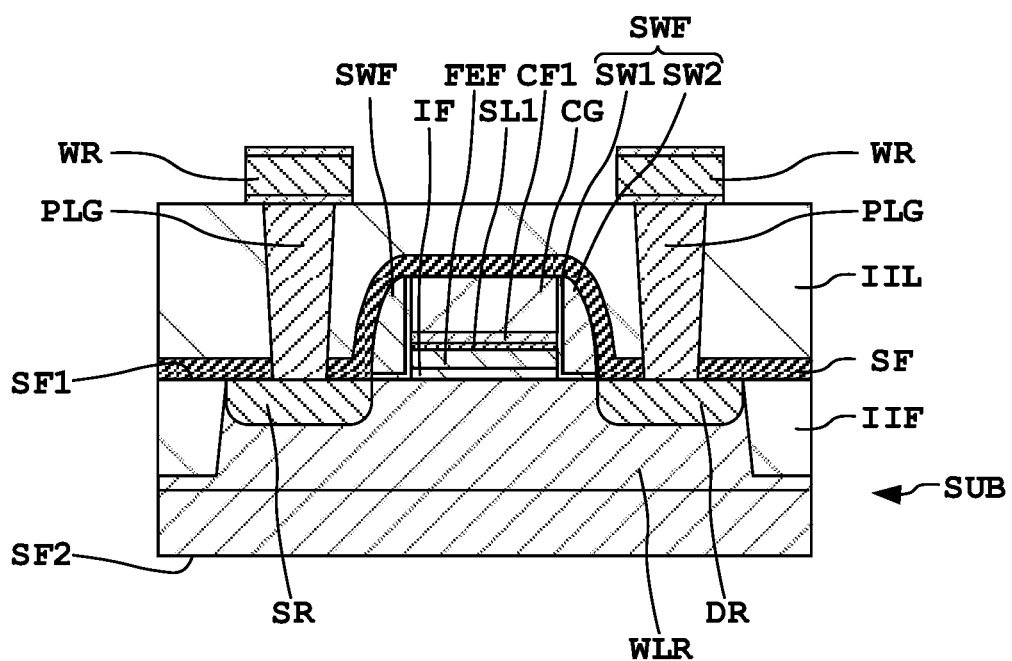
FIG. 16 is a cross-sectional view illustrating an exemplary step included in the method of manufacturing the semiconductor device according to the first embodiment.

Subsequently, as shown in FIG. 16, the plug PLG and the wiring WR are formed. The plug PLG is formed in the interlayer insulating layer IIL and the stress film SF so as to reach the source region SR, the drain region DR or the control gate electrode CG. The plug PLG is formed by forming a through hole in the interlayer insulating layer IIL and the stress film SF, by burying a conductive material in the through hole. The wiring WR is formed, for example, by forming the conductive film by a sputtering method, and then, patterning the conductive film to a desired shape.

Finally, by dicing the structures obtained by the above steps, a plurality of singulated semiconductor device SD1 are obtained.

By the above manufacturing method, the semiconductor device SD1 according to the first embodiment is manufactured.

(Effect of the First Seed Layer)

In the semiconductor device SD1 according to the embodiment, the first seed layer SL1 is formed between the ferroelectric film FEF and the first conductive film CF1. The material of the first seed layer SL1 includes at least one material of the ferroelectric film FEF and at least one material of the first conductive film CF1. As a result, it is estimated that an intermolecular force between the ferroelectric film FEF and the first seed layer SL1 and an intermolecular force between the first conductive film CF1 and the first seed layer SL1 are greater than an intermolecular force between the ferroelectric film FEF and the first conductive film CF1. As a result, in the semiconductor device SD1 according to the first embodiment, the ferroelectric film FEF and the first conductive film CF1 are more strongly bonded through the first seed layer SL1 as compared with when the semiconductor device SD1 does not include the first seed layer SL1. As a result, it is possible to suppress peeling of the ferroelectric film FEF and the first conductive film CF1 in the manufacturing process of the semiconductor device SD1. Consequently, the characteristics of the semiconductor device SD1 can be enhanced.

The semiconductor device SD1 including the first seed layer SL1 is more effective when the semiconductor device SD1 includes the stress film SF and the sidewall insulating film SWF. Stresses caused by the stress film SF and the sidewall insulating film SWF are applied not only to the semiconductor substrate SUB but also to the ferroelectric film FEF and the first conductive film CF1. As described above, the first seed layer SL1 enhances the bonding strength between the ferroelectric film FEF and the first conductive film CF1. Thus, the first seed layer SL1 can suppress peeling of the ferroelectric film FEF from the first conductive film CF1. Consequently, it is possible to suppress a decrease in the properties of semiconductor device SD1 due to peeling of the ferroelectric film FEF from the first conductive film CF1. Consequently, the characteristics of the semiconductor device SD1 can be enhanced.

Further, the lattice constant of the material of the first seed layer SL1 is closer to the lattice constant of the ferroelectric film FEF having a rectangular crystal system compared to the lattice constant of the material of the first conductive film CF1. Therefore, in the above crystallization step, crystallization of the amorphous film AMF can be promoted. Consequently, the characteristics of the semiconductor device SD1 can be enhanced.

(Effect)

The semiconductor device SD1 according to the first embodiment includes the first seed layer SL1 formed between the ferroelectric film FEF and the first conductive film CF1. Consequently, the characteristics of the semiconductor device SD1 can be enhanced.

[Modification]

Figure 19:
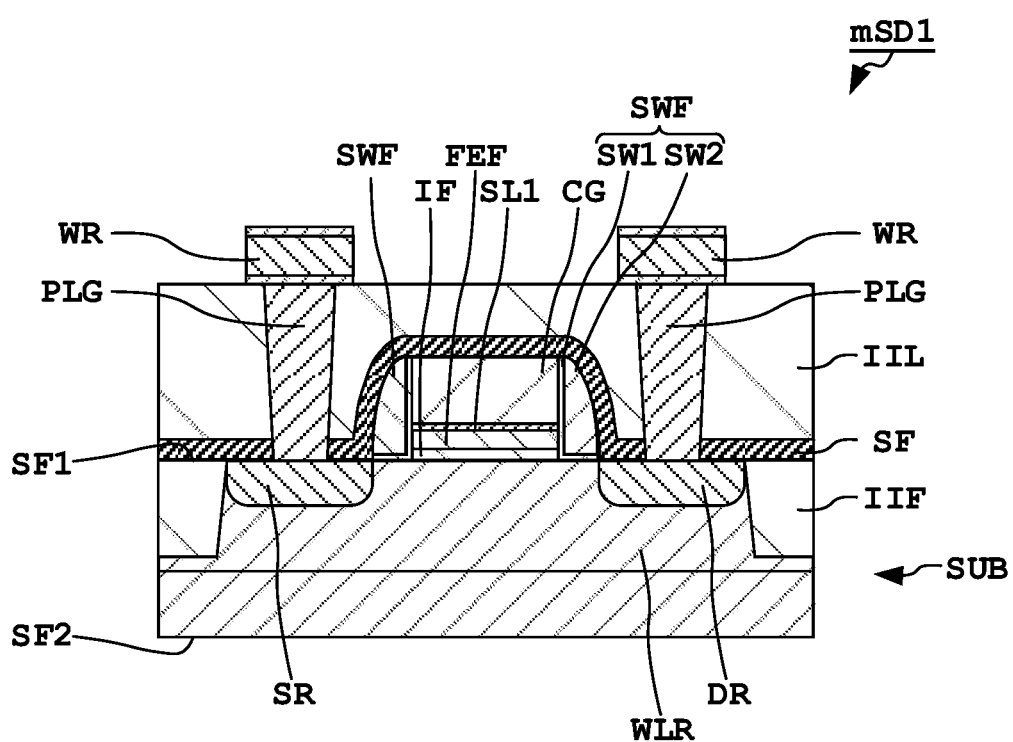
FIG. 19 is a plan view illustrating an exemplary configuration of a main portion of a semiconductor device according to modification of the first embodiment.

FIG. 19 is a cross-sectional view illustrating an exemplary configuration of a main portion of a semiconductor device mSD1 according to a modification of the first embodiment. As shown in FIG. 19, the semiconductor device mSD1 according to modification does not include the first conductive film CF1. The control gate electrode CG is formed on the first seed layer SL1 without the conductive film CF. In the semiconductor device mSD1 according to modification, the control gate electrode CG is directly formed on the first seed layer SL1. Thus, it is possible to increase the adhesion between the control gate electrode CG and the first seed layer SL1. Consequently, the characteristics of the semiconductor device mSD1 can be improved.

Figure 20:
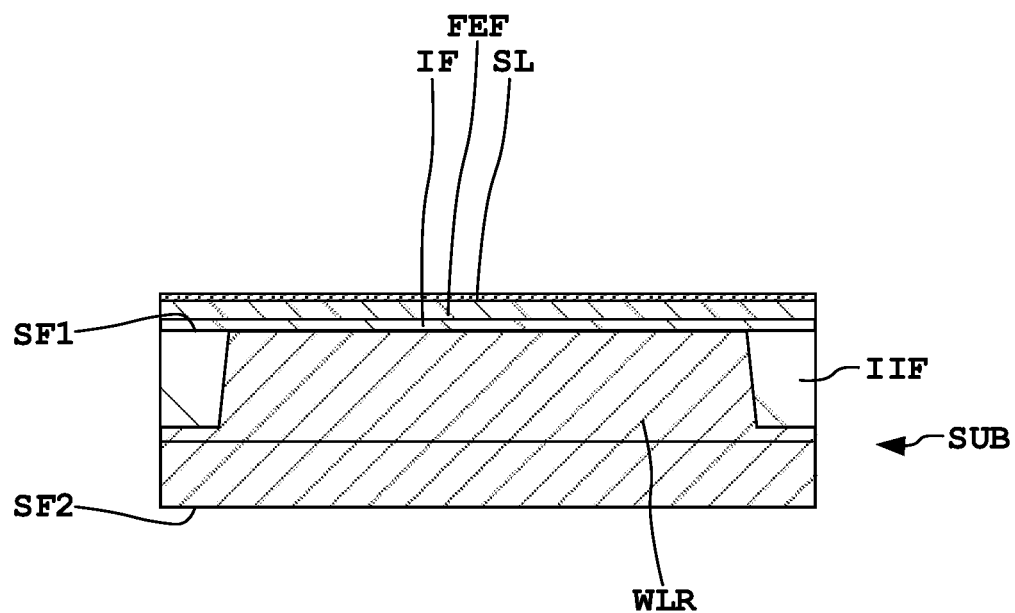
FIG. 20 is a cross-sectional view illustrating an exemplary step of removing a first conductive film included in a method of manufacturing the semiconductor device according to the modification of the first embodiment.

FIG. 20 is a cross-sectional view illustrating an exemplary step of removing the first conductive film CF1 included in a method of manufacturing the semiconductor device mSD1 according to the modification. The method of manufacturing the semiconductor device mSD1 according to the modification further includes removing the first conductive film CF1 between the crystallization (see FIG. 9) and forming the control gate electrodes CG (see FIG. 10). A method of removing the first conductive film CF1 is, for example, a dry-etching method. At this time, the first seed layer SL1 functions as an etching stopper. As a result, it is possible to suppress the ferroelectric film FEF is damaged due to over-etching.

Second Embodiment

A semiconductor device SD2 according to a second embodiment includes a first seed layer SL1 formed on an upper surface of a ferroelectric film FEF, and a second seed layer SL2 formed on a lower surface of the ferroelectric film FEF. Hereinafter, the same components as those of the semiconductor device SD1 according to the first embodiment will be denoted by the same reference numerals, and descriptions thereof will be omitted.

(Configuration of Semiconductor Device)

Figure 21:
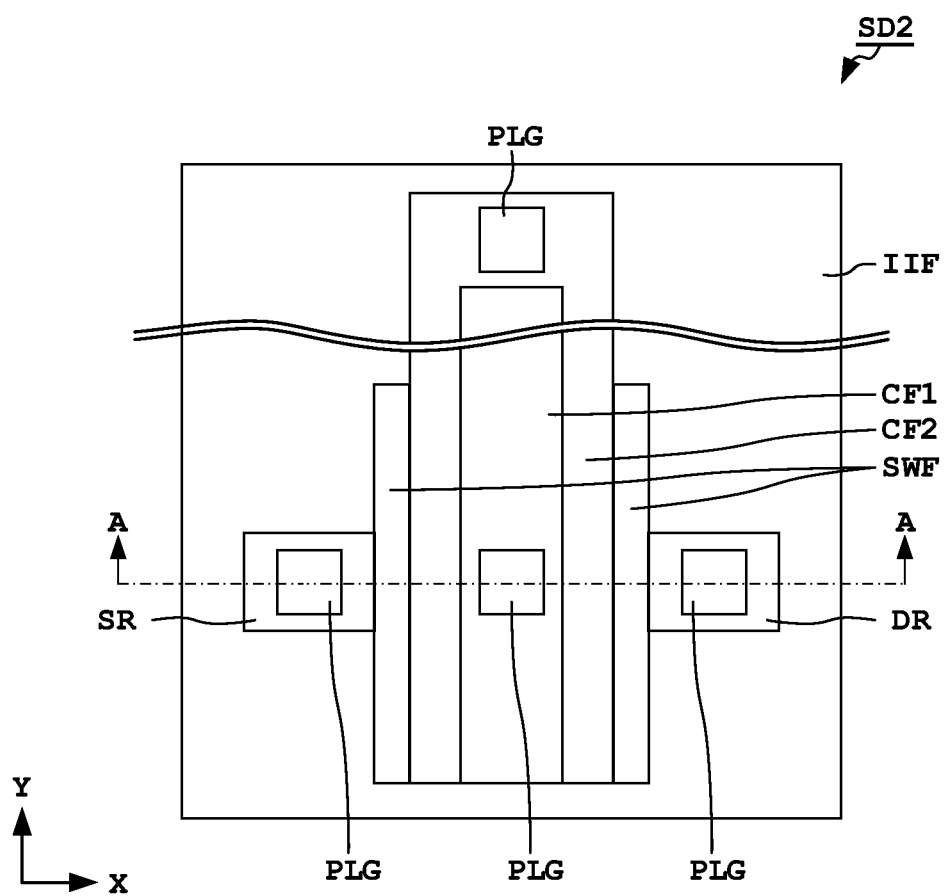
FIG. 21 is a plan view illustrating an exemplary configuration of a main portion of a semiconductor device according to a second embodiment.
Figure 22:
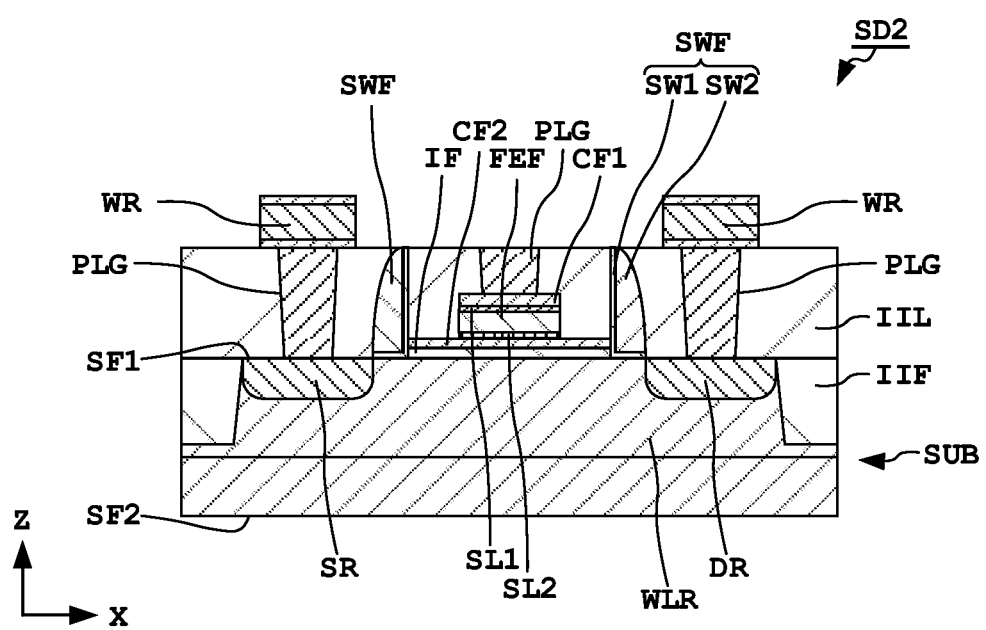
FIG. 22 is a cross-sectional view illustrating an exemplary configuration of the main portion of the semiconductor device according to the second embodiment.

FIG. 21 is a plan view illustrating an exemplary configuration of a main portion of the semiconductor device SD2. FIG. 22 is a cross-sectional view illustrating an exemplary configuration of the main portion of the semiconductor device SD2. FIG. 22 is a cross-sectional view taken along line A-A of FIG. 21.

The semiconductor device SD 2 includes a semiconductor substrate SUB, an isolation insulating film IIF, an insulating film IF, a second conductive film CF2, a second seed layer SL2, a ferroelectric film FEF, a first seed layer SL1, a first conductive film CF1, a pair of sidewall insulating films SWF, an interlayer insulating layer II L, a plug PLG, and a wiring WR.

The second conductive film CF2 is formed on the insulating film IF. The second conductive film CF2 is formed between the insulating film IF and the ferroelectric film FEF. A part of second conductive film CF2 is exposed from the ferroelectric film FEF. Thus, as shown in FIG. 21, it is possible to secure a region for the plug PLG reaching the second conductive film CF2 is formed. In plan view, a size of the second conductive film CF2 is greater than a size of the first conductive film CF1 and the ferroelectric film FEF.

From the viewpoint of suppressing the plug PLG from penetrating the second conductive film CF2, it is preferable that a thickness of the second conductive film CF2 is large. Further, in a plurality of the ferroelectric memory cells (not shown), when the second conductive film CF2 is integrally formed as a single member, it is preferable that the resistance value of the second conductive film CF2 is large from the viewpoint of suppressing the voltage from being applied to another ferroelectric memory cell. In this instance, it is preferable that the thickness of the second conductive film CF2 is small. For example, it is preferable that the thickness of the second conductive film CF2 is smaller than the thickness of the first conductive film CF1. From the above viewpoint, the thickness of the second conductive film CF2 is preferably 1 nm or more and 5 nm or less.

A material of the second conductive film CF2 is, for example, titanium nitride. The material of the second conductive film CF2 may be the same as or different from the material of the first conductive film CF1.

The second seed layer SL2 is formed on the second conductive film CF2. The second seed layer SL2 is formed on a lower surface of the ferroelectric film FEF. The second seed layer SL2 is sandwiched between the ferroelectric film FEF and the second conductive film CF2. That is, the second seed layer SL2 directly contacts with the ferroelectric film FEF and the second conductive film CF2.

A function of the second seed layer SL2 is the same as a function of the first seed layer SL1. Examples of a material and a thickness of the second seed layer SL2 are similar to the material and the thickness of the first seed layer SL1 The material of the second seed layer SL2 may be the same as or different from the material of the first seed layer SL1 The thickness of the second seed layer SL2 may be the same as or different from the thickness of the first seed layer SL1.

The plug PLG is formed in the interlayer insulating layer IIL such that the plug PLG reaches the source region SR, the drain region DR, the first conductive film CF1 or the second conductive film CF2.

(Operation of Semiconductor Device)

Next, the operation of the semiconductor device SD2 will be described. Here, the operation of one ferroelectric memory cell constituting the semiconductor device SD2 will be described. Hereinafter, a write operation, an erase operation, and a read operation will be described, respectively.

Figure 23:
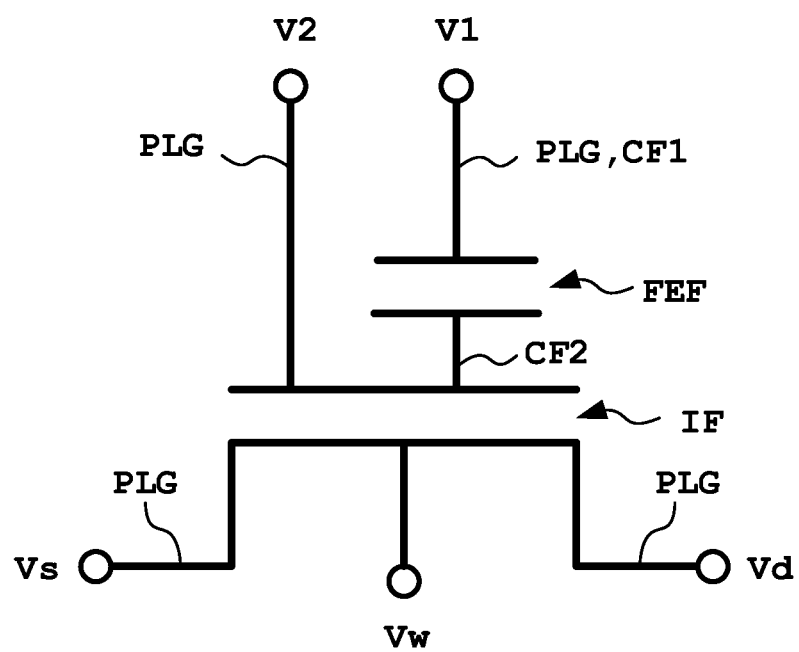
FIG. 23 is a circuit diagram showing an equivalent circuit of the main portion of the semiconductor device according to the second embodiment.
Figure 25:
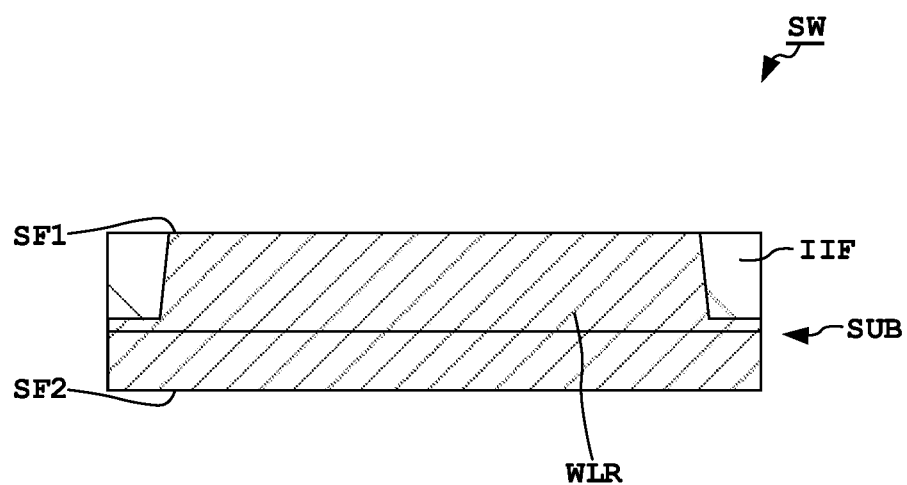
FIG. 25 is a cross-sectional view illustrating an exemplary step included in a method of manufacturing the semiconductor device according to the second embodiment.
Figure 26:
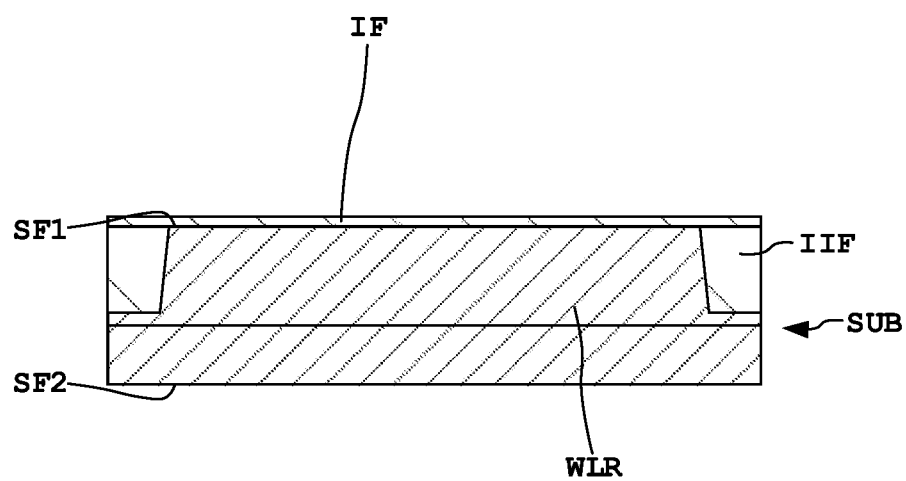
FIG. 26 is a cross-sectional view illustrating an exemplary step included in the method of manufacturing the semiconductor device according to the second embodiment.

FIG. 23 is a circuit diagram showing an equivalent circuit of the main portion of the semiconductor device SD2. FIG. 24 is a table showing examples of voltages applied to respective portions of the semiconductor device SD2 in each of the write operation, the erase operation, and the read operation. In FIGS. 23 and 24, Vs indicates a voltage applied to the source region SR. Vd indicates a voltage applied to the drain region DR. Vw indicates a voltage applied to the well region WLR. V1 indicates a voltage applied to the first conductive film CF1. V2 indicates a voltage applied to the second conductive film CF2.

(Write Operation)

While a voltage of the same magnitude is applied to the source region SR and the drain region DR, a negative voltage $-V_{EC}$ is applied to the second conductive film CF2, and a positive voltage $V_{EC}$ is applied to the well region WLR and the first conductive film CF1. Thus, the polarization state of the ferroelectric film FEF becomes a first polarization state. That is, the state of the ferroelectric memory cell is a write state. The voltage $V_{EC}$ is, for example, 3 V. The respective voltages of the source region SR and drain region DR are, for example, 0 V.

(Erase Operation)

A positive voltage $V_{EC}$ is applied to the second conductive film CF2 while a voltage of the same magnitude is applied to the source region SR and the drain region DR, and a negative voltage $-V_{EC}$ is applied to the well region WLR and the first conductive film CF1. Thus, the polarization state of the ferroelectric film FEF becomes a second polarization state. That is, the ferroelectric memory cell is in an erase state. The respective voltages of the source region SR and the drain region DR are, for example, 0 V.

(Read Operation)

Bias is applied between the source region SR and the drain region DR while a voltage VR of a predetermined magnitude is applied to the first conductive film CF1 and the second conductive film CF2. For example, a voltage $V_{dd}$ is applied to the source region SR, and the potentials of the drain region DR and the well region WLR are set to 0 V. The voltage $V_{dd}$ is, for example, a voltage 1 V. From the viewpoint of preventing the polarization state of the ferroelectric film FEF is changed, the voltage V1 applied to the first conductive film CF1 and the voltage V2 applied to the second conductive film CF2 are the same to each other. The voltage VR is set to be greater than the threshold voltage of the ferroelectric memory cell in the erase state and smaller than the threshold voltage of the ferroelectric memory cell in the write state. As a result, almost no current flows in the ferroelectric memory cell in the programmed state, and current flows in the ferroelectric memory cell in the erased state. In this manner, the state of the ferroelectric memory cell is read out based on the magnitude of the current value flowing in the ferroelectric memory cell. The voltage VR is, for example, 0 V. From the viewpoint of suppressing an effect of the voltage VR on the polarization state of the ferroelectric film FEF, the floating potential may be supplied to the first conductive film CF1 and the second conductive film CF2.

(Method of Manufacturing Semiconductor Device)

Next, an exemplary method of manufacturing the semiconductor device SD2 according to the second embodiment will be described. FIGS. 25 to 39 are cross-sectional views illustrating exemplary steps included in the method of manufacturing the semiconductor device SD2.

A method of manufacturing the semiconductor device SD2 according to the second embodiment, (1) providing a semiconductor wafer SW, (2) forming the insulating film IF, (3) forming the second conductive film CF2, (4) forming the amorphous film AMF, (5) forming the first conductive film CF1, (6) forming the first seed layer SL1 and the second seed layer SL2, (7) crystallizing, (8) first patterning (9) forming a sacrificial layer SL, (10) second patterning, (11) forming the sidewall insulating film SWF, (12) forming the source region SR and the drain region DR, (13) removing the sacrificial layer SL, (14) forming the interlayer insulating layer IIL, and (15) forming the plug PLG and the wiring WR.

(1) Providing a semiconductor wafer SW (see FIG. 25), (2) forming the insulating film IF (see FIG. 26), (4) forming the amorphous film AMF (see FIG. 28), (5) forming the first conductive film CF1 (see FIG. 29), (7) crystallizing (see FIG. 31), (12) forming the source region SR and the drain region DR (see FIG. 36), (14) forming the interlayer insulating layer IIL (see FIGS. 38), and (15) forming the plug PLG and the wiring WR (see FIG. 39) are the same as first embodiment, and thus description thereof will be omitted. Therefore, (3) forming the second conductive film CF2, (6) forming the first seed layer SL1 and the second seed layer SL2, (8) forming the first patterning, (9) forming the sacrificial layer SL, (10) second patterning, (11) forming the sidewall insulating film SWF, and (13) removing the sacrificial layer SL will be described.

(3) Forming the Second Conductive Film CF2

Figure 27:
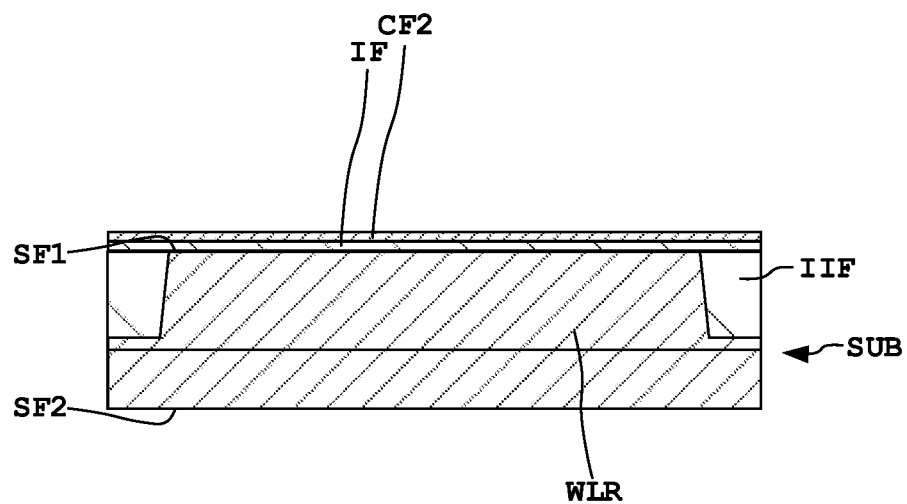
FIG. 27 is a cross-sectional view illustrating an exemplary step included in the method of manufacturing the semiconductor device according to the second embodiment.
Figure 28:
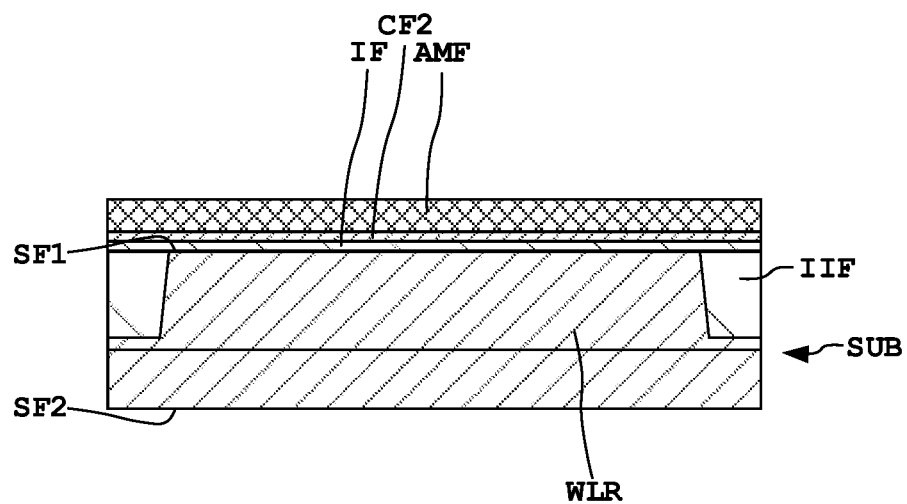
FIG. 28 is a cross-sectional view illustrating an exemplary step included in the method of manufacturing the semiconductor device according to the second embodiment.
Figure 29:
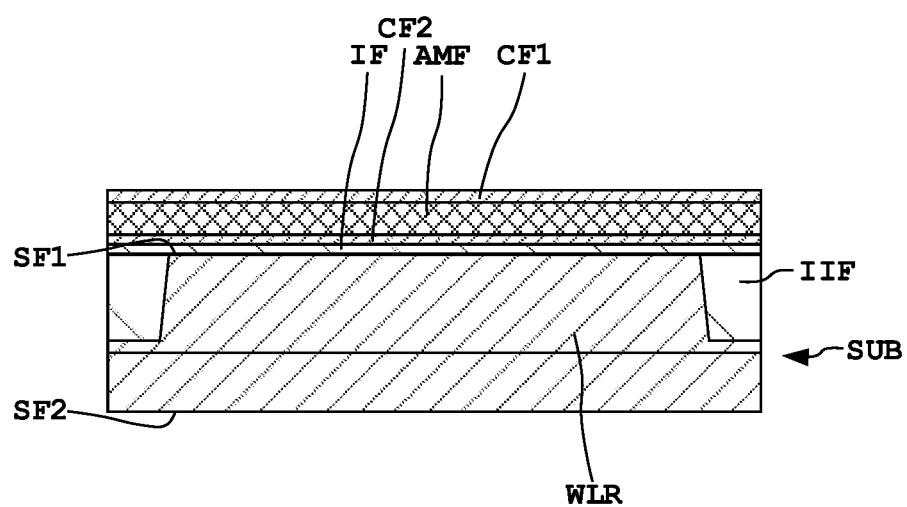
FIG. 29 is a cross-sectional view illustrating an exemplary step included in the method of manufacturing the semiconductor device according to the second embodiment.

Subsequently, as shown in FIG. 27, the second conductive film CF2 is formed on the insulating film IF. A method of forming the second conductive film CF2 is, for example, a sputtering method. In this step, the second conductive film CF2 is not patterned, it is formed on an entirety of the insulating film IF.

(6) Forming the First Seed Layer SL1 and the Second Seed Layer SL2

Figure 30:
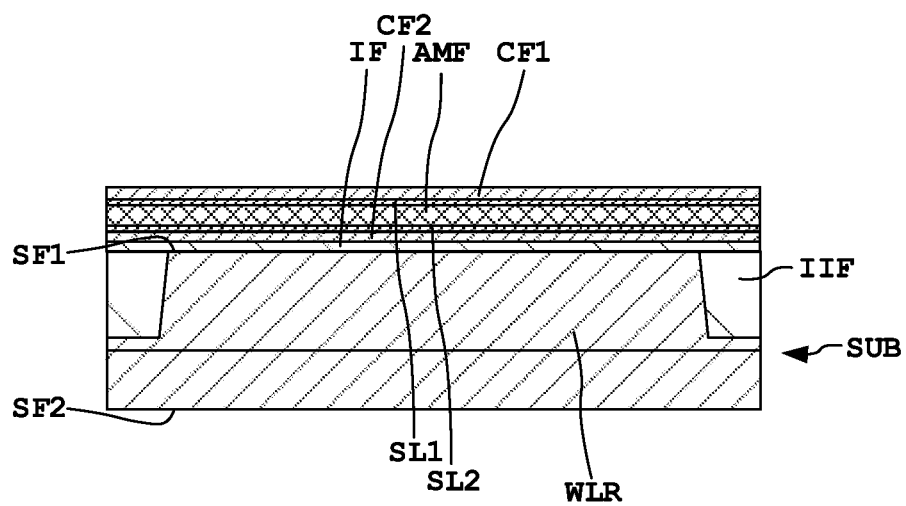
FIG. 30 is a cross-sectional view illustrating an exemplary step included in the method of manufacturing the semiconductor device according to the second embodiment.
Figure 31:
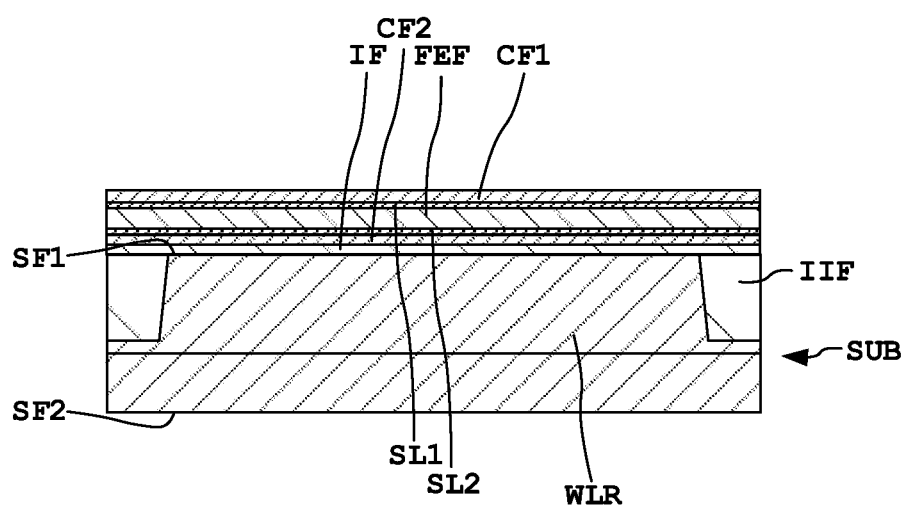
FIG. 31 is a cross-sectional view illustrating an exemplary step included in the method of manufacturing the semiconductor device according to the second embodiment.

Subsequently, as shown in FIG. 30, the first seed layer SL1 is formed between the first conductive film CF1 and an upper surface of the amorphous film AMF, and the second seed layer SL2 is formed between the second conductive film CF2 and a lower surface of the amorphous film AMF. Specifically, similarly to the first embodiment, a heat treatment of the first temperature T1 is performed to the amorphous film AMF, first conductive film CF1 and the second conductive film CF2 (see FIGS. 18 and 19).

(8) First Patterning

Figure 32:
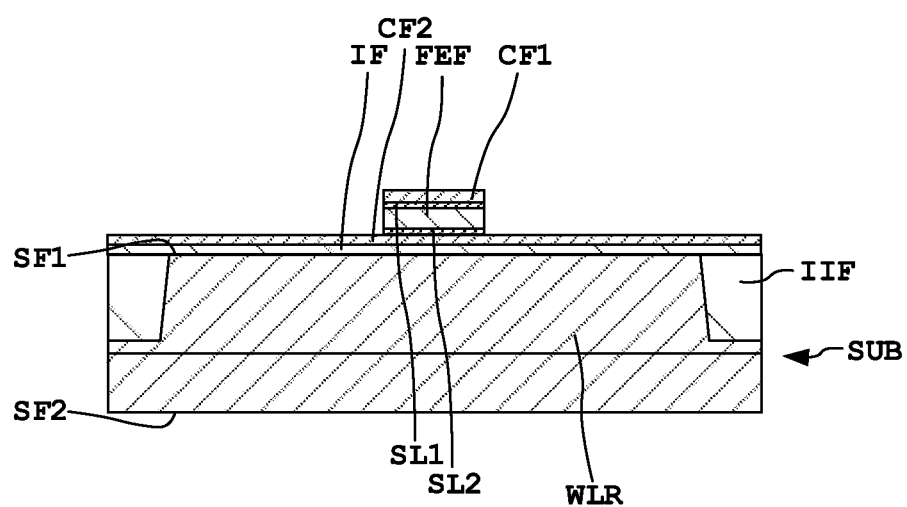
FIG. 32 is a cross-sectional view illustrating an exemplary step included in the method of manufacturing the semiconductor device according to the second embodiment.

Subsequently, as shown in FIG. 32, the second seed layer SL2, the ferroelectric film FEF, the first seed layer SL1, and the first conductive film CF1 are patterned so that the desired pattern is achieved. Patterning is performed, for example, by photolithography method and etching method. Although not shown in particular, a resist mask is formed on a region other than the area to be etched. The first seed layer SL1 may or may not be patterned. In the second embodiment, the first seed layer SL1 is patterned.

(9) Forming a Sacrificial Layer SL

Figure 33:
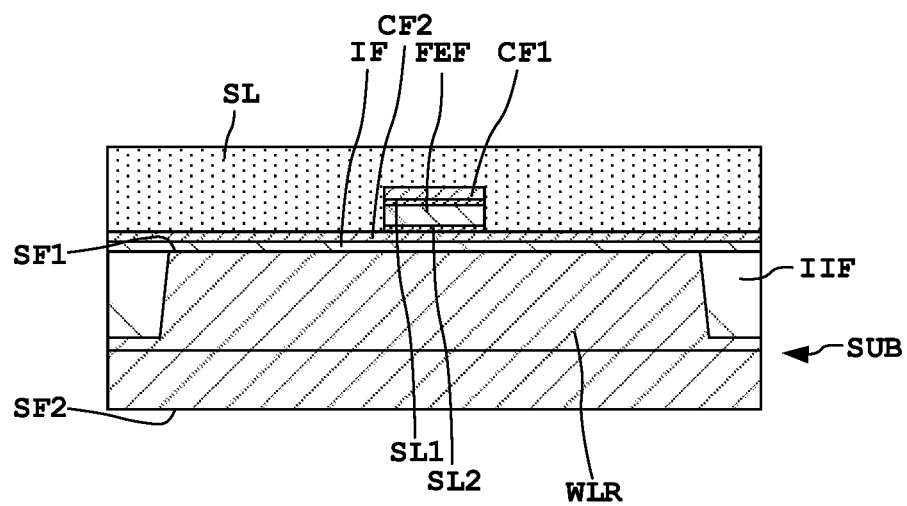
FIG. 33 is a cross-sectional view illustrating an exemplary step included in the method of manufacturing the semiconductor device according to the second embodiment.

Subsequently, as shown in FIG. 33, a sacrificial layer SL is formed on the second conductive film CF2 so as to cover the second conductive film CF2, the ferroelectric film FEF, and the first conductive film CF1. The sacrificial layer SL is, for example, a polycrystalline silicon layer. The sacrifice layer SL is formed by, for example, a CVD method.

(10) Second Patterning

Figure 34:
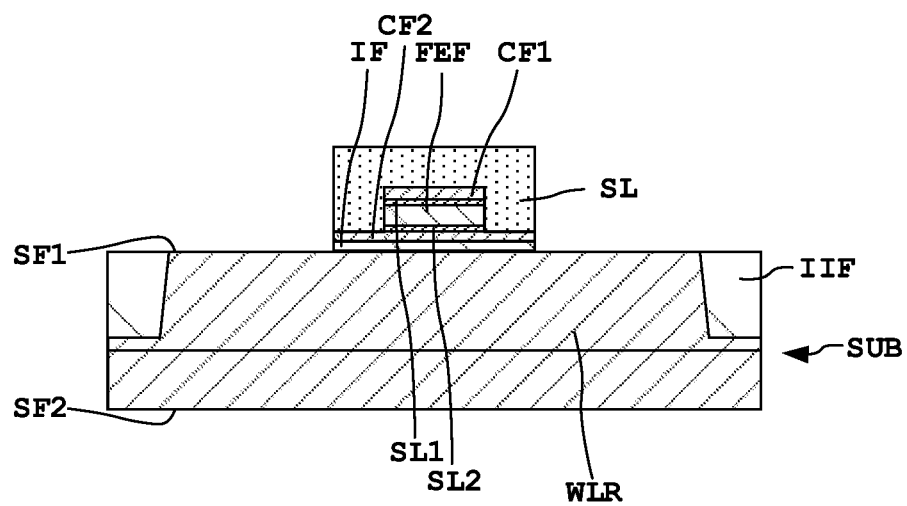
FIG. 34 is a cross-sectional view illustrating an exemplary step included in the method of manufacturing the semiconductor device according to the second embodiment.

Subsequently, the insulating film IF, the second conductive film CF2 and the sacrificial layer SL are patterned so that the desired pattern is achieved, as shown in FIG. 34. A method of patterning is, for example, photolithography method and etching method. Although not shown in particular, a resist mask is formed on a region other than a region to be etched.

(11) Forming the Sidewall Insulating Film SWF

Figure 35:
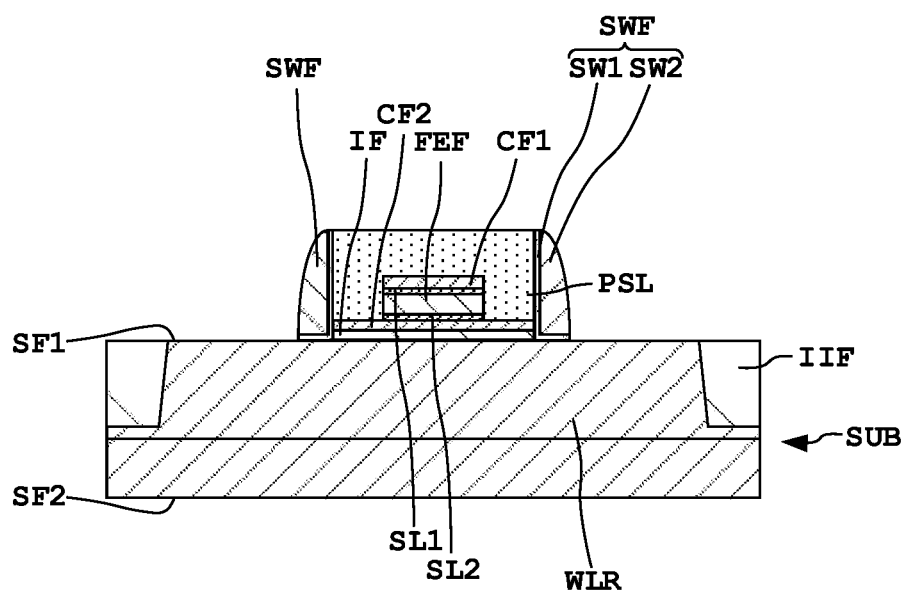
FIG. 35 is a cross-sectional view illustrating an exemplary step included in the method of manufacturing the semiconductor device according to the second embodiment.
Figure 36:
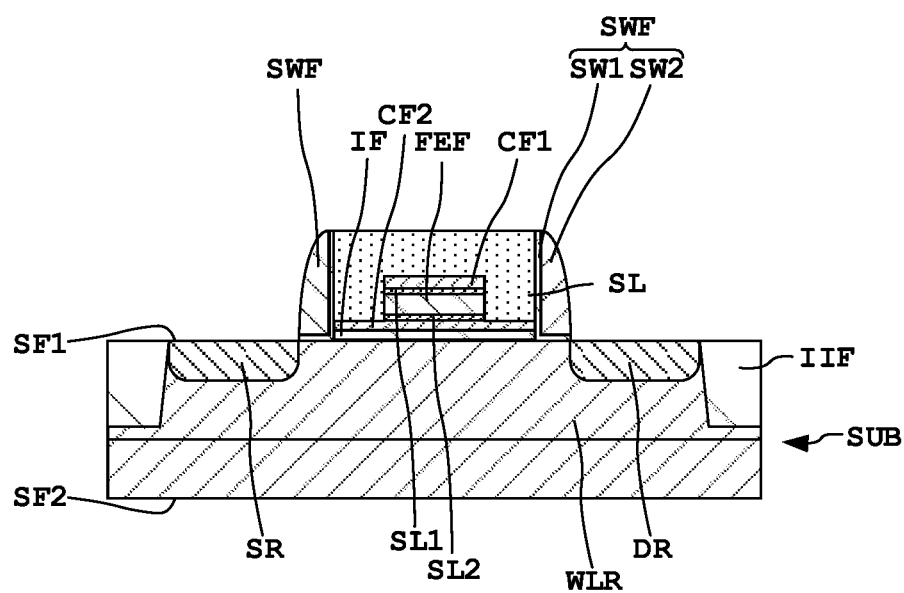
FIG. 36 is a cross-sectional view illustrating an exemplary step included in the method of manufacturing the semiconductor device according to the second embodiment.

Subsequently, as shown in FIG. 35, the pair of sidewall insulating films SWF is formed on the first surface SF1 of the semiconductor substrate SUB so as to sandwich a structure including the insulating film IF, the second conductive film CF2 and the sacrificial layer SL. After a stacked-layer film including the first insulating film and the second insulating film is formed on the first surface SF1 of the semiconductor substrate SUB so as to sandwich the structure, a part of the stacked-layer film is removed so that a part, of the stacked-layer film, located on a sidewall of the structure remains. The part of the stacked film is removed by, for example, a photolithography method and an etching method.

(13) Removing the Sacrificial Layer SL

Figure 37:
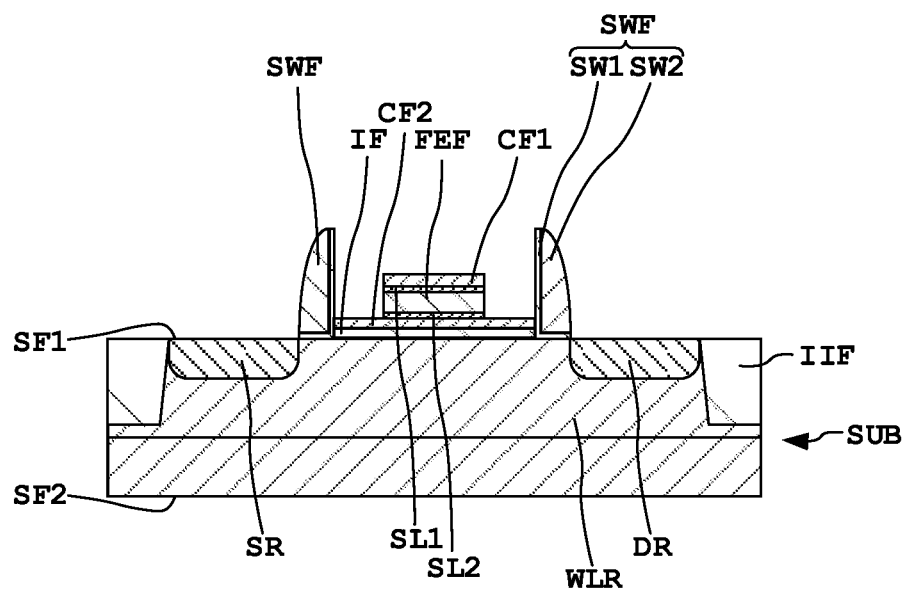
FIG. 37 is a cross-sectional view illustrating an exemplary step included in the method of manufacturing the semiconductor device according to the second embodiment.
Figure 38:
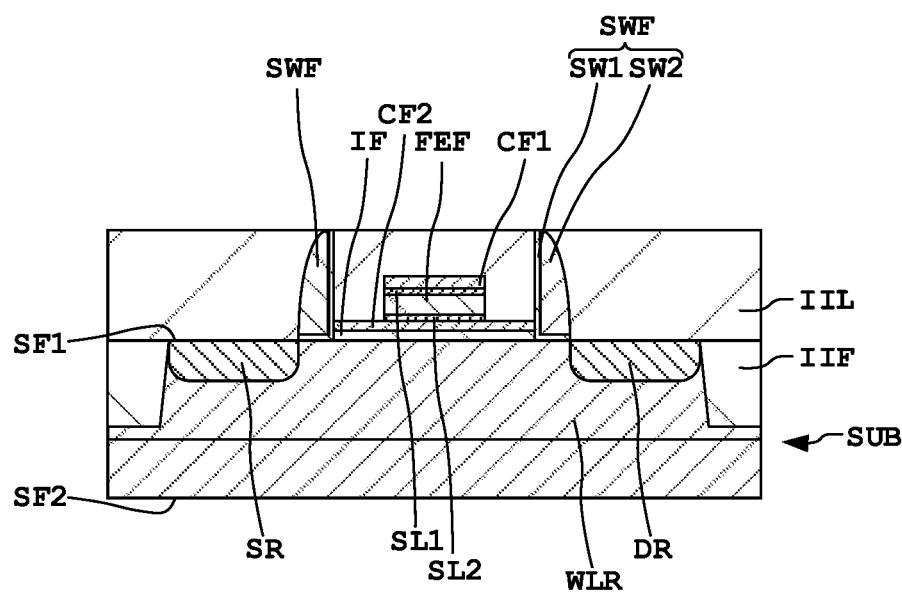
FIG. 38 is a cross-sectional view illustrating an exemplary step included in the method of manufacturing the semiconductor device according to the second embodiment.
Figure 39:
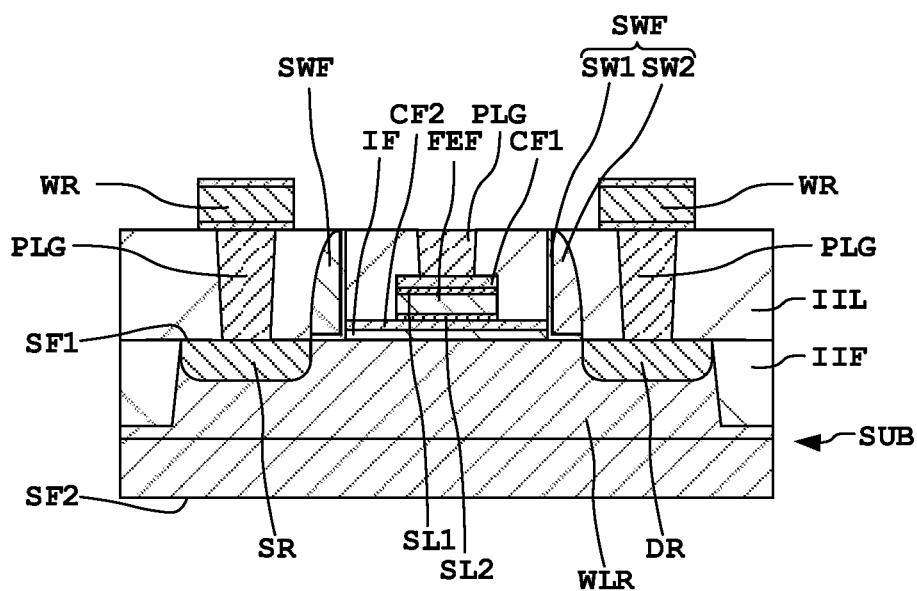
FIG. 39 is a cross-sectional view illustrating an exemplary step included in the method of manufacturing the semiconductor device according to the second embodiment.

Subsequently, the sacrificial layer SL is removed, as shown in FIG. 37. A method of removing the sacrificial layer SL, for example, a wet etching method or an isotropic dry etching method. An etching solution used for wet etching is, for example, a mixed solution of aqueous ammonia and aqueous hydrogen peroxide.

Finally, by dicing the structures obtained by the above steps, a plurality of singulated semiconductor device SD2 are obtained.

By the above manufacturing method, the semiconductor device SD2 according to the second embodiment is manufactured.

(Effect)

The second embodiment has the same effects as the first embodiment. The semiconductor device SD2 according to the second embodiment includes the first seed layer SL1 and the second seed layer SL2. Therefore, the ferroelectric film FEF is strongly bonded to the first conductive film CF1 through the first seed layer SL1 and strongly bonded to the second conductive film CF2 through the second seed layer SL2. In addition, in crystallization step, crystallization of the amorphous film AMF is further promoted by the first seed layer SL1 and the second seed layer SL2. As a consequence, the properties of semiconductor device SD2 can be further enhanced.

Further, the semiconductor device SD2 according to the second embodiment includes the plug PLG formed such that the plug PLG reaches the second conductive film CF2 and the plug PLG formed such that the plug PLG reaches the ferroelectric film FEF through the first conductive film CF1. Thus, a voltage is applied to the ferroelectric film FEF between the two plugs PLG without the well region WLR. Therefore, in the write operation and the erase operation, the voltage for applying to the ferroelectric film FEF is not divided into the insulating film IF. A Voltage of the desired magnitude can be applied to the ferroelectric film FEF. As a result, the reliability of the semiconductor device SD2 can be enhanced. Further, since the voltage for applying to the ferroelectric film FEF is not divided into the insulating film IF, it is not necessary to increase the applied voltage. Consequently, the second embodiment can reduce the driving voltage of the semiconductor device SD2.

Third Embodiment

The semiconductor device SD3 according to the third embodiment includes a first seed layer SL1 formed on an upper surface of a ferroelectric film FEF, and a second seed layer SL2 formed on a lower surface of the ferroelectric film FEF. Hereinafter, the same elements as those of the semiconductor device SD1 according to the first embodiment and the semiconductor device SD2 according to the second embodiment are denoted by the same reference numerals, and descriptions thereof are omitted.

(Configuration of Semiconductor Device)

Figure 40:
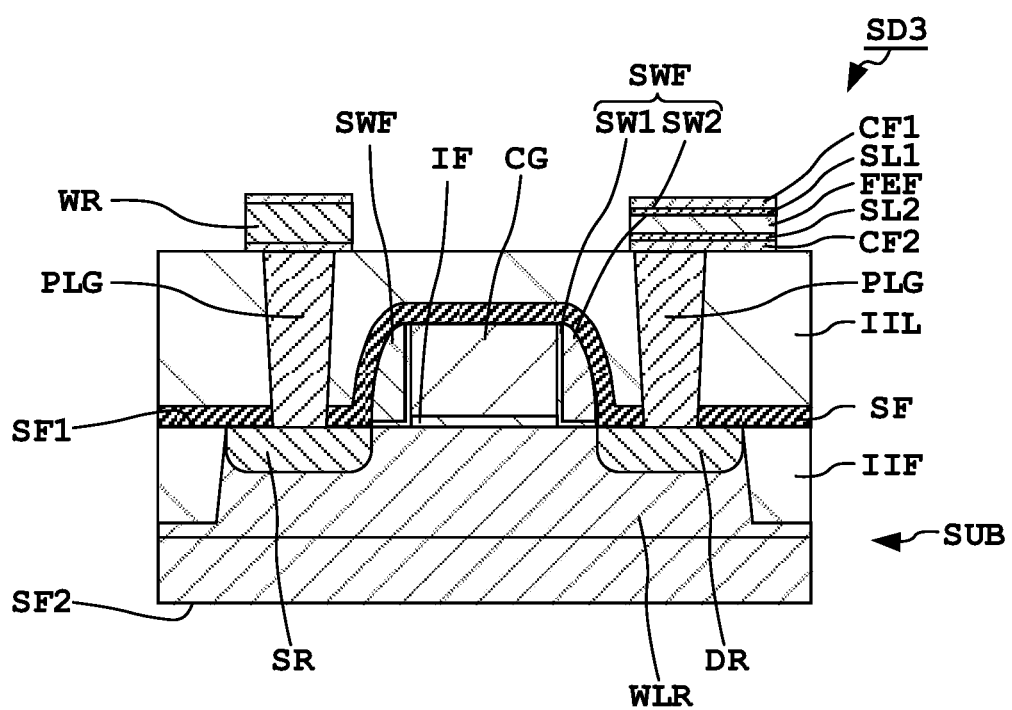
FIG. 40 is a cross-sectional view illustrating an exemplary configuration of a main portion of a semiconductor device according to a third embodiment.

FIG. 40 is a cross-sectional view illustrating an exemplary configuration of a main portion of a semiconductor device SD3 according to a third embodiment. A semiconductor device SD 3 includes a semiconductor substrate SUB, an isolation insulating film IIF, an insulating film IF, a control gate electrodes CG, a pair of sidewall insulating films SWF, a stress film SF, an interlayer insulating layer IIL, a plug PLG, a second conductive film CF2, a second seed layer SL2, a ferroelectric film FEF, a first seed layer SL1, a first conductive film CF1, and a wiring WR.

Each of elements is similar to the first embodiment and the second embodiment, except for the location where they are formed. Therefore, detailed description is omitted. The structure including the second conductive film CF2, the second seed layer SL2, the ferroelectric film FEF, the first seed layer SL1, and the first conductive film CF1 is formed on the interlayer insulating layer IIL in this order. The second conductive film CF2 is electrically connected with the drain area DR through the plug PLG. Incidentally, the structure may be formed in the same layer as the wiring WR as a first layer, or may be formed in the same layer as a second layer or more. There is no any wiring between the wiring WR as the first layer and the semiconductor substrate. In the third embodiment, the structure is formed in the same layer as the wiring WR as the first layer.

(Method of Manufacturing Semiconductor Device)

A method of manufacturing the semiconductor device SD3 according to the third embodiment is also the same as the first embodiment and the second embodiment except for the locations where the structures is formed. Therefore, detailed description is omitted.

(Effect)

The third embodiment has the same effects as the second embodiment. The semiconductor device SD3 according to the third embodiment includes a structure including the second conductive film CF2, the second seed layer SL2, the ferroelectric film FEF, the first seed layer SL1, and the first conductive film CF1 formed in the same layer as a layer in which the wiring WR is formed. Therefore, the semiconductor device SD3 does not need to include the insulating film IF. Thus, voltage can be applied only to the ferroelectric film FEF during the write operation and the erase operation. As a result, it is possible to reduce the write and erase voltages, thereby reducing the power consumption.

It should be noted that the present invention is not limited to the above-mentioned embodiments, and various modifications can be made without departing from the gist thereof. For example, the semiconductor device SD2, SD3 according to the second and third embodiments may not include the first conductive film CF1.

Further, the first seed layer SL1 and the second seed layer SL2 may not be formed by heat treatment of the ferroelectric film FEF, the first conductive film CF1, and the second conductive film CF2. The first seed layer SL1 and the second seed layer SL2 may be formed by, for example, a sputtering method.

Furthermore, the semiconductor device may include only the second seed layer SL2 formed on the lower surface of the ferroelectric film FEF without including the first seed layer SL1.

In addition, even when a specific numerical value example is described, it may be a numerical value exceeding the specific numerical value, or may be a numerical value less than the specific numerical value, except when it is theoretically obviously limited to the numerical value. In addition, the component means "B including A as a main component" or the like, and the mode including other components is not excluded.

What is claimed is:

1. A semiconductor device comprising:
a semiconductor substrate including a source region and a drain region which are formed on a main surface of the semiconductor substrate;
an insulating film formed on the main surface of the semiconductor substrate such that the insulating film is located between the source region and the drain region in plan view;
a ferroelectric film formed on the insulating film, the ferroelectric film including hafnium and oxygen;
a first seed layer formed on the ferroelectric film; and
a control gate electrode formed on the ferroelectric film,
wherein a material of the first seed layer includes at least one material of the ferroelectric film and at least one material of the first conductive film.

2. The semiconductor device according to claim 1, comprising a first conductive film formed on the first seed layer.

3. The semiconductor device according to claim 2,
wherein a thickness of the first seed layer is smaller than a thickness of each of the ferroelectric film and the first conductive film.

4. The semiconductor device according to claim 2, comprising:
a second conductive film formed between the insulating film and the ferroelectric film; and
a second seed layer formed between the second conductive film and the ferroelectric film.

5. The semiconductor device according to claim 4,
wherein the second conductive film is exposed from the ferroelectric film.

6. The semiconductor device according to claim 2,
wherein the material of the first seed layer includes titanium, oxygen and nitrogen, and
wherein the material of the first conductive film includes titanium and nitrogen.

7. A method of manufacturing a semiconductor device, comprising:
forming an amorphous film on an insulating film;
forming a conductive film on the amorphous film;
performing a heat treatment at a first temperature to the amorphous film and the conductive film to form a seed layer between the amorphous film and the conductive film;
after performing the heat treatment at the first temperature, crystallizing the amorphous film by a heat treatment at a second temperature higher than the first temperature to form a ferroelectric film,
wherein a material of the seed layer includes at least one material of the amorphous film and at least one material of the conductive film.

8. The method of manufacturing a semiconductor device according to claim 7,
wherein water and hydrogen are desorbed from the amorphous film by the heat treatment at the first temperature, and
wherein a desorption amount of water is greater than a desorption amount of hydrogen.

9. The method of manufacturing a semiconductor device according to claim 8,
wherein the first temperature is 400° C. or more and 500° C. or less.

10. The method of manufacturing a semiconductor device according to claim 9,
wherein the second temperature is 600° C. or more and 800° C. or less.

11. The method of manufacturing a semiconductor device according to claim 7, comprising removing the conductive film after crystallizing the amorphous film.

12. The method of manufacturing a semiconductor device according to claim 7,
wherein the material of the seed layer includes titanium, oxygen and nitrogen, and
wherein the material of the conductive film includes titanium and nitrogen.

* * * * *